(12) United States Patent
Zych et al.

(10) Patent No.: US 9,719,015 B2
(45) Date of Patent: Aug. 1, 2017

(54) $EU^{2+}$-ACTIVATED PHOSPHORS

(71) Applicant: Merck Patent GmbH, Darmstadt (DE)

(72) Inventors: Aleksander Zych, Seeheim-Jugenheim (DE); Ralf Petry, Griesheim (DE); Holger Winkler, Darmstadt (DE); Christof Hampel, Frankfurt am Main (DE); Andreas Benker, Lautertal (DE); Thomas Juestel, Witten (DE)

(73) Assignee: MERCK PATENT GMBH, Darmstadt (DE)

( * ) Notice: Subject to any disclaimer, the term of this patent is extended or adjusted under 35 U.S.C. 154(b) by 46 days.

(21) Appl. No.: 15/101,432

(22) PCT Filed: Nov. 6, 2014

(86) PCT No.: PCT/EP2014/002973
§ 371 (c)(1),
(2) Date: Jun. 3, 2016

(87) PCT Pub. No.: WO2015/082032
PCT Pub. Date: Jun. 11, 2015

(65) Prior Publication Data
US 2016/0304779 A1  Oct. 20, 2016

(30) Foreign Application Priority Data

Dec. 4, 2013  (EP) .................................. 13005646

(51) Int. Cl.
*C09K 11/77* (2006.01)
*H01L 33/50* (2010.01)
(Continued)

(52) U.S. Cl.
CPC ........ *C09K 11/7742* (2013.01); *C01G 30/026* (2013.01); *C01G 31/006* (2013.01);
(Continued)

(58) Field of Classification Search
CPC . C09K 11/7728; H01L 33/501; H01L 33/502; H01L 33/504
See application file for complete search history.

(56) References Cited

U.S. PATENT DOCUMENTS 4,443,380 A * 4/1984 Yamazoe ............... C09K 11/06
　　　　　　　　　　　　　　　　　　　252/301.16
4,572,803 A * 2/1986 Yamazoe ............... C09K 11/06
　　　　　　　　　　　　　　　　　　　252/301.16
(Continued)

FOREIGN PATENT DOCUMENTS

CN　　　102191048 A　　9/2011
CN　　　103232847 A　　8/2013

OTHER PUBLICATIONS

Peng et al., "Reduction from Eu3+ to Eu2+ in BaAl2O4:Eu phosphor prepared in an oxidizing atmosphere and luminescent properties of BaAl2O4:Eu", May 2007, Journal of Luminesence 127 (2007) 735-740.*

(Continued)

*Primary Examiner* — Evan Pert
(74) *Attorney, Agent, or Firm* — Millen, White, Zelano, Branigan, P.C.

(57) ABSTRACT

The invention relates to $Eu^{2+}$-activated phosphors, to a process of its preparation, the use of these phosphors in electronic and electro optical devices, such as light emitting diodes (LEDs) and solar cells and especially to illumination units comprising said magnesium alumosilicate-based phosphors.

18 Claims, 4 Drawing Sheets

(51) Int. Cl.
*C01G 30/02* (2006.01)
*C01G 31/00* (2006.01)
*C01G 33/00* (2006.01)
*C01G 35/00* (2006.01)
*H01L 33/32* (2010.01)
*H01L 33/58* (2010.01)

(52) U.S. Cl.
CPC ......... *C01G 33/006* (2013.01); *C01G 35/006* (2013.01); *C09K 11/7728* (2013.01); *C09K 11/7731* (2013.01); *C09K 11/7736* (2013.01); *H01L 33/32* (2013.01); *H01L 33/501* (2013.01); *H01L 33/502* (2013.01); *H01L 33/504* (2013.01); *H01L 33/58* (2013.01); *H01L 2933/0041* (2013.01)

(56) References Cited

U.S. PATENT DOCUMENTS

| | | | | |
|---|---|---|---|---|
| 5,514,298 | A * | 5/1996 | Terrell | C09K 11/7733 250/483.1 |
| 6,761,837 | B2 * | 7/2004 | Comanzo | H01J 61/42 252/301.4 R |
| 7,022,263 | B2 * | 4/2006 | Comanzo | C09K 11/665 252/301.4 H |
| 7,112,921 | B2 * | 9/2006 | Menkara | C09K 11/885 252/301.6 S |
| 7,790,058 | B2 * | 9/2010 | Shimomura | C09K 11/0883 252/301.4 F |
| 7,968,005 | B2 * | 6/2011 | Ceintrey | C09K 11/7734 252/301.4 F |
| 7,981,321 | B2 * | 7/2011 | Schmidt | C09K 11/0838 252/301.4 F |

OTHER PUBLICATIONS

International Search Report dated Dec. 19, 2014 issued in corresponding PCT/EP2014/002973 application (pp. 1-4).

Written Opinion of the International Searching Authority dated Dec. 19, 2014 issued in corresponding PCT/EP2014/002973 application (pp. 1-4).

X. Yan et al., "Preparation and Luminescent Properties of a Novel Red Emitting Phosphor of Ca1—2xMxIn2O4:xEu3+(M=Li, Na, K) for White LED Solid-State Lighting", Journal of Alloys and Compounds, vol. 508 (2010) pp. 475-479.

W. Zhi-Jun et al., "Improving Luminescent Property of SrIn2O4:Eu3+ by Co-Doped A+ (A=Li, Na, K) or Sm3+", Chinese Physics B, vol. 22, No. 4 (2013) pp. 047804-1-047804-5.

Y.S. Chang et al., "The Effect of Eu3+ -Activated InVO4 Phosphors Prepared by Sol-Gel Method", Optical Materials, vol. 33 (2011) pp. 375-380.

Y.Y. Tsai et al., "A Novel Single-Phased White Light Emitting Phosphor of Eu3+ Ions-Doped Ca2LaTaO6", Materials Chemistry and Physics, vol. 143 (2014) pp. 611-615.

C. Zhao et al., "Novel Red Perovskite Phosphor Ca2AlNbO6:Eu3+ for White Light-Emitting Diode Application", Physica B, vol. 406 (2011) pp. 4608-4611.

* cited by examiner

EU²⁺-ACTIVATED PHOSPHORS

TECHNICAL FIELD

The invention relates to Eu²⁺-activated phosphors, to a process of the preparation of these phosphors, the use of these phosphors in electronic and/or electro optical devices, such as light emitting diodes (LEDs) and solar cells, and especially to illumination units comprising said phosphors.

BACKGROUND ART

White light-emitting diodes (LEDs) exhibit high efficiency, long lifetimes, less environmental impact, absence of mercury, short response times, applicability in final products of various sizes, and many more favorable properties. They are gaining attention as backlight sources for liquid crystal displays, computer notebook monitors, cell phone screens, and in general lighting.

By combining red, green, and blue emitting phosphors with an near UV LED, which typically emits light at a wavelength ranging from 280 to 400 nm, as a primary light source, it is possible to obtain a tri-color white LED with better luminescence strength and superior white color.

Typically, a red, a green, and a blue emitting phosphor are first mixed in a suitable resin. The resultant gel is then provided on a UV-LED chip or a near UV-LED chip, and hardened by UV irradiation, annealing, or similar processes. The phosphor mixture in the resin should be as homogeneously dispersed as possible in order to observe an even, white color, while looking at the chip from all angles. However, it is still difficult to obtain a uniform distribution of the different phosphors in the resin because of their different particle sizes, shapes and/or their density in the resin. Hence, it is advantageous to use less than three phosphors.

However, even by using a mixture of two phosphors, in order to produce white LEDs using UV or near UV-LEDs, it is still difficult to uniformly mix phosphors having different sizes, particle shapes, and densities in the resin. Moreover, the phosphors should not be excited by a wavelength located in the visible range. For instance, if the emission spectrum of the green phosphor overlaps with the excitation spectrum of the red phosphor, then color tuning becomes difficult. Additionally, if a mixture of two or more phosphors is used to produce white LEDs using a blue emitting LED as the primary light source, the excitation wavelength of each phosphor should efficiently overlap with the blue emission wavelength of the LED.

As known to the expert, white LEDs can be also obtained by adding a yellow emitting phosphor to a blue light emitting LED.

Typically, the yellow phosphor used in such applications is yttrium aluminum garnet activated by Ce³⁺, $Y_3Al_5O_{12}$:Ce³⁺, (YAG:Ce) as described for example in S. Nakamura, G. Fasol, "The Blue Laser Diode", (1997) p. 343. Also some ortho-silicates $M_2SiO_4$:Eu²⁺(M=Ca, Sr, Ba) are suggested, to be used as yellow-orange emitters, as disclosed for example in G. Blasse, et al., Philips Res. Rep., 23 (1968) 189. Moreover various nitrides and oxy-nitrides, doped with divalent europium or trivalent cerium ions, such as $M_2Si_5N_8$:Eu²⁺(M=Sr, Ba), may be utilized as described in H. A. Höppe, H. Lutz, P. Morys, W. Schnick, A. Seilmeier, J. Phys. Chem. Solids 61 (2000) 2001.

However, the aforementioned materials suffer from the fact that the spectral region covered, is not sufficient to produce warm white light. Moreover, the nitrides and oxy-nitrides are expensive host lattices, due to the physical properties of the starting nitride materials, namely hygroscopicity and sensitivity to ambient atmosphere.

Accordingly, there is still room for improvements and modern luminescent materials should, preferably exhibit one or more of the following properties:
  exhibit high colour rendering indices (CRI),
  exhibit a broad emission band in the range of the VIS-light, especially in the red range of the spectra,
  are effectively excitable by an blue light or near UV emitting primary light source,
  exhibit broad excitation bands,
  exhibit high quantum yields,
  exhibit high phase purities,
  exhibit high efficiency over a prolonged period of use,
  have high chemical stability, preferably against humidity or moisture,
  exhibit higher thermal quenching resistivity, and
  are obtainable by method of production, which should be cost efficient and especially suitable for a mass production process.

In view of the cited prior art and the above-mentioned requirements on modern luminescent materials, there is still a considerable demand for alternative materials, which preferably do not exhibit the drawbacks of available phosphors of prior art or even if do so, to a less extent.

DISCLOSURE OF INVENTION

Surprisingly, the inventors have found that Eu²⁺-activated phosphors of the present invention represent excellent alternatives to already known phosphors of the prior art, and preferably improve one or more of the above-mentioned requirements in view of the prior art, or more preferably, fulfil all above-mentioned requirements at the same time.

Besides other beneficial properties, the phosphors according to the present invention exhibit upon excitation by blue or near UV radiation a broad emission peak in the range of VIS-light, preferably in the range from ranging from approximately 500 nm to approximately 800 nm. Moreover, they exhibit a low thermal quenching resistivity, have high chemical stability, and have high colour rendering properties, while being utilized in an LED.

Thus, the present invention relates to a compound of formula I, $$M^{II}_2 M^{III} M^V O_6 : Eu^{2+} \qquad\qquad I$$

wherein
  $M^{II}$ denotes one or more bivalent elements selected from the group of Be, Mg, Ca, Sr, Ba, and Zn
  $M^{III}$ denotes one or more trivalent elements selected from the group of B, Al, Ga, In, Tl, Sc, Y, La, Ce, Gd, and Lu, and
  $M^V$ denotes one or more pentavalent elements selected from the Group of V, Nb, Ta, As, Sb, and Bi.

The invention further relates to a method for the production of the compounds according to the present invention, the use of a compound according to the present invention as a conversion phosphor converting all or some parts of a blue or near UV radiation into longer wavelength, mixtures comprising at least one compound according to the present invention; the use of a compound according to the present invention or a mixture comprising a compound according to the present invention in electronic and/or electro optical devices, such as light emitting diodes (LEDs) and solar cells, and especially to illumination units comprising the compounds according to the present invention.

DETAILED DESCRIPTION OF THE INVENTION

Figure 1:
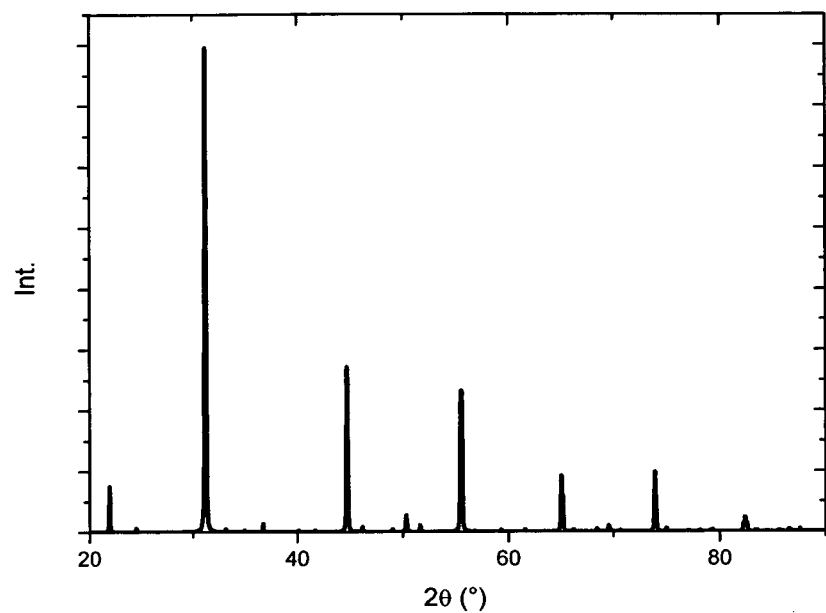
FIG. 1 shows a XRD pattern (measured by the wavelength $Cu_{K\alpha}$) of $Sr_2InTaO_6:Eu^{2+}$.

In a preferred embodiment of the present invention, the compounds of formula I are selected from the compounds of formula Ia, $$M^{II}_{(2-x)}M^{III}M^{V}O_6:Eu^{2+}_x \quad \text{Ia}$$

wherein $M^{II}$, $M^{III}$, and $M^{V}$ have the same meanings as given above in formula I, and $0 < x \leq 2$.

In preferred embodiment, $M^{III}$ is selected from one or more, preferably from two or more, trivalent elements selected from the group of B, Al, Ga, In, Tl, Sc, Y, La, Ce, Gd, and Lu.

Preferably, the compounds of formula I are selected from the group of compounds of formula Ia-1, $$M^{II}_{(2-x)}(M^1_{(a-b)}M^2_b)M^{V}O_6:Eu^{2+}_x \quad \text{Ia-1}$$

wherein x, $M^{II}$ and $M^{V}$ have the same meanings as given above in formula Ia, $M^1$ and $M^2$ denote each and independently from another one element selected from B, Al, Ga, In, Tl, Sc, Y, La, Ce, Gd, or Lu, whereby $M^1 \neq M^2$, $0 < a \leq 1$, $0 \leq b < 1$, and $a+b=1$, Further preferred compounds are selected from the group of compounds of formula Ia-I wherein $M^1$ denotes In, such as, for example, $Be_{(2-X)}(In_{(a-b)}B_b)VO_6:Eu^{2+}_x$; $Be_{(2-X)}(In_{(a-b)}Al_b)VO_6:Eu^{2+}_x$;
$Be_{(2-X)}(In_{(a-b)}Ga_b)VO_6:Eu^{2+}_x$; $Be_{(2-X)}(In_{(a-b)}Tl_b)VO_6:Eu^{2+}_x$;
$Be_{(2-X)}(In_{(a-b)}Sc_b)VO_6:Eu^{2+}_x$; $Be_{(2-X)}(In_{(a-b)}Y_b)VO_6:Eu^{2+}_x$;
$Be_{(2-X)}(In_{(a-b)}La_b)VO_6:Eu^{2+}_x$; $Be_{(2-X)}(In_{(a-b)}Ce_b)VO_6:Eu^{2+}_x$;
$Be_{(2-X)}(In_{(a-b)}Gd_b)VO_6:Eu^{2+}_x$; $Be_{(2-X)}(In_{(a-b)}Lu_b)VO_6:Eu^{2+}_x$;
$Be_{(2-X)}(In_{(a-b)}B_b)NbO_6:Eu^{2+}_x$; $Be_{(2-X)}(In_{(a-b)}Al_b)NbO_6:Eu^{2+}_x$;
$Be_{(2-X)}(In_{(a-b)}Ga_b)NbO_6:Eu^{2+}_x$; $Be_{(2-X)}(In_{(a-b)}Tl_b)NbO_6:Eu^{2+}_x$;
$Be_{(2-X)}(In_{(a-b)}Sc_b)NbO_6:Eu^{2+}_x$; $Be_{(2-X)}(In_{(a-b)}Y_b)NbO_6:Eu^{2+}_x$;
$Be_{(2-X)}(In_{(a-b)}La_b)NbO_6:Eu^{2+}_x$; $Be_{(2-X)}(In_{(a-b)}Ce_b)NbO_6:Eu^{2+}_x$;
$Be_{(2-X)}(In_{(a-b)}Gd_b)NbO_6:Eu^{2+}_x$; $Be_{(2-X)}(In_{(a-b)}Lu_b)NbO_6:Eu^{2+}_x$;
$Be_{(2-X)}(In_{(a-b)}B_b)TaO_6:Eu^{2+}_x$; $Be_{(2-X)}(In_{(a-b)}Al_b)TaO_6:Eu^{2+}_x$;
$Be_{(2-X)}(In_{(a-b)}Ga_b)TaO_6:Eu^{2+}_x$; $Be_{(2-X)}(In_{(a-b)}Tl_b)TaO_6:Eu^{2+}_x$;
$Be_{(2-X)}(In_{(a-b)}Sc_b)TaO_6:Eu^{2+}_x$; $Be_{(2-X)}(In_{(a-b)}Y_b)TaO_6:Eu^{2+}_x$;
$Be_{(2-X)}(In_{(a-b)}La_b)TaO_6:Eu^{2+}_x$; $Be_{(2-X)}(In_{(a-b)}Ce_b)TaO_6:Eu^{2+}_x$;
$Be_{(2-X)}(In_{(a-b)}Gd_b)TaO_6:Eu^{2+}_x$; $Be_{(2-X)}(In_{(a-b)}Lu_b)TaO_6:Eu^{2+}_x$;
$Be_{(2-X)}(In_{(a-b)}B_b)SbO_6:Eu^{2+}_x$; $Be_{(2-X)}(In_{(a-b)}Al_b)SbO_6:Eu^{2+}_x$;
$Be_{(2-X)}(In_{(a-b)}Ga_b)SbO_6:Eu^{2+}_x$; $Be_{(2-X)}(In_{(a-b)}Tl_b)SbO_6:Eu^{2+}_x$;
$Be_{(2-X)}(In_{(a-b)}Sc_b)SbO_6:Eu^{2+}_x$; $Be_{(2-X)}(In_{(a-b)}Y_b)SbO_6:Eu^{2+}_x$;
$Be_{(2-X)}(In_{(a-b)}La_b)SbO_6:Eu^{2+}_x$; $Be_{(2-X)}(In_{(a-b)}Ce_b)SbO_6:Eu^{2+}_x$;
$Be_{(2-X)}(In_{(a-b)}Gd_b)SbO_6:Eu^{2+}_x$; $Be_{(2-X)}(In_{(a-b)}Lu_b)SbO_6:Eu^{2+}_x$;
$Be_{(2-X)}(In_{(a-b)}B_b)BiO_6:Eu^{2+}_x$; $Be_{(2-X)}(In_{(a-b)}Al_b)BiO_6:Eu^{2+}_x$;
$Be_{(2-X)}(In_{(a-b)}Ga_b)BiO_6:Eu^{2+}_x$; $Be_{(2-X)}(In_{(a-b)}Tl_b)BiO_6:Eu^{2+}_x$;
$Be_{(2-X)}(In_{(a-b)}Sc_b)BiO_6:Eu^{2+}_x$; $Be_{(2-X)}(In_{(a-b)}Y_b)BiO_6:Eu^{2+}_x$;
$Be_{(2-X)}(In_{(a-b)}La_b)BiO_6:Eu^{2+}_x$; $Be_{(2-X)}(In_{(a-b)}Ce_b)BiO_6:Eu^{2+}_x$;
$Be_{(2-X)}(In_{(a-b)}Gd_b)BiO_6:Eu^{2+}_x$; $Be_{(2-X)}(In_{(a-b)}Lu_b)BiO_6:Eu^{2+}_x$;
$Mg_{(2-X)}(In_{(a-b)}B_b)VO_6:Eu^{2+}_x$; $Mg_{(2-X)}(In_{(a-b)}Al_b)VO_6:Eu^{2+}_x$;
$Mg_{(2-X)}(In_{(a-b)}Ga_b)VO_6:Eu^{2+}_x$; $Mg_{(2-X)}(In_{(a-b)}Tl_b)VO_6:Eu^{2+}_x$;
$Mg_{(2-X)}(In_{(a-b)}Sc_b)VO_6:Eu^{2+}_x$; $Mg_{(2-X)}(In_{(a-b)}Y_b)VO_6:Eu^{2+}_x$;
$Mg_{(2-X)}(In_{(a-b)}La_b)VO_6:Eu^{2+}_x$; $Mg_{(2-X)}(In_{(a-b)}Ce_b)VO_6:Eu^{2+}_x$;
$Mg_{(2-X)}(In_{(a-b)}Gd_b)VO_6:Eu^{2+}_x$; $Mg_{(2-X)}(In_{(a-b)}Lu_b)VO_6:Eu^{2+}_x$;
$Mg_{(2-X)}(In_{(a-b)}B_b)NbO_6:Eu^{2+}_x$; $Mg_{(2-X)}(In_{(a-b)}Al_b)NbO_6:Eu^{2+}_x$;
$Mg_{(2-X)}(In_{(a-b)}Ga_b)NbO_6:Eu^{2+}_x$; $Mg_{(2-X)}(In_{(a-b)}Tl_b)NbO_6:Eu^{2+}_x$;
$Mg_{(2-X)}(In_{(a-b)}Sc_b)NbO_6:Eu^{2+}_x$; $Mg_{(2-X)}(In_{(a-b)}Y_b)NbO_6:Eu^{2+}_x$;
$Mg_{(2-X)}(In_{(a-b)}La_b)NbO_6:Eu^{2+}_x$; $Mg_{(2-X)}(In_{(a-b)}Ce_b)NbO_6:Eu^{2+}_x$;
$Mg_{(2-X)}(In_{(a-b)}Gd_b)NbO_6:Eu^{2+}_x$; $Mg_{(2-X)}(In_{(a-b)}Lu_b)NbO_6:Eu^{2+}_x$;
$Mg_{(2-X)}(In_{(a-b)}B_b)TaO_6:Eu^{2+}_x$; $Mg_{(2-X)}(In_{(a-b)}Al_b)TaO_6:Eu^{2+}_x$;
$Mg_{(2-X)}(In_{(a-b)}Ga_b)TaO_6:Eu^{2+}_x$; $Mg_{(2-X)}(In_{(a-b)}Tl_b)TaO_6:Eu^{2+}_x$;
$Mg_{(2-X)}(In_{(a-b)}Sc_b)TaO_6:Eu^{2+}_x$; $Mg_{(2-X)}(In_{(a-b)}Y_b)TaO_6:Eu^{2+}_x$;
$Mg_{(2-X)}(In_{(a-b)}La_b)TaO_6:Eu^{2+}_x$; $Mg_{(2-X)}(In_{(a-b)}Ce_b)TaO_6:Eu^{2+}_x$;
$Mg_{(2-X)}(In_{(a-b)}Gd_b)TaO_6:Eu^{2+}_x$; $Mg_{(2-X)}(In_{(a-b)}Lu_b)TaO_6:Eu^{2+}_x$;

$Mg_{(2-X)}(In_{(a-b)}B_b)SbO_6:Eu^{2+}_X$; $Mg_{(2-X)}(In_{(a-b)}Al_b)SbO_6:Eu^{2+}_X$;
$Mg_{(2-X)}(In_{(a-b)}Ga_b)SbO_6:Eu^{2+}_X$; $Mg_{(2-X)}(In_{(a-b)}Tl_b)SbO_6:Eu^{2+}_X$;
$Mg_{(2-X)}(In_{(a-b)}Sc_b)SbO_6:Eu^{2+}_X$; $Mg_{(2-X)}(In_{(a-b)}Y_b)SbO_6:Eu^{2+}_X$;
$Mg_{(2-X)}(In_{(a-b)}La_b)SbO_6:Eu^{2+}_X$; $Mg_{(2-X)}(In_{(a-b)}Ce_b)SbO_6:Eu^{2+}_X$;
$Mg_{(2-X)}(In_{(a-b)}Gd_b)SbO_6:Eu^{2+}_X$; $Mg_{(2-X)}(In_{(a-b)}Lu_b)SbO_6:Eu^{2+}_X$;
$Mg_{(2-X)}(In_{(a-b)}B_b)BiO_6:Eu^{2+}_X$; $Mg_{(2-X)}(In_{(a-b)}Al_b)BiO_6:Eu^{2+}_X$;
$Mg_{(2-X)}(In_{(a-b)}Ga_b)BiO_6:Eu^{2+}_X$; $Mg_{(2-X)}(In_{(a-b)}Tl_b)BiO_6:Eu^{2+}_X$;
$Mg_{(2-X)}(In_{(a-b)}Sc_b)BiO_6:Eu^{2+}_X$; $Mg_{(2-X)}(In_{(a-b)}Y_b)BiO_6:Eu^{2+}_X$;
$Mg_{(2-X)}(In_{(a-b)}La_b)BiO_6:Eu^{2+}_X$; $Mg_{(2-X)}(In_{(a-b)}Ce_b)BiO_6:Eu^{2+}_X$;
$Mg_{(2-X)}(In_{(a-b)}Gd_b)BiO_6:Eu^{2+}_X$; $Mg_{(2-X)}(In_{(a-b)}Lu_b)BiO_6:Eu^{2+}_X$;
$Ca_{(2-X)}(In_{(a-b)}B_b)VO_6:Eu^{2+}_X$; $Ca_{(2-X)}(In_{(a-b)}Al_b)VO_6:Eu^{2+}_X$;
$Ca_{(2-X)}(In_{(a-b)}Ga_b)VO_6:Eu^{2+}_X$; $Ca_{(2-X)}(In_{(a-b)}Tl_b)VO_6:Eu^{2+}_X$;
$Ca_{(2-X)}(In_{(a-b)}Sc_b)VO_6:Eu^{2+}_X$; $Ca_{(2-X)}(In_{(a-b)}Y_b)VO_6:Eu^{2+}_X$;
$Ca_{(2-X)}(In_{(a-b)}La_b)VO_6:Eu^{2+}_X$; $Ca_{(2-X)}(In_{(a-b)}Ce_b)VO_6:Eu^{2+}_X$;
$Ca_{(2-X)}(In_{(a-b)}Gd_b)VO_6:Eu^{2+}_X$; $Ca_{(2-X)}(In_{(a-b)}Lu_b)VO_6:Eu^{2+}_X$;
$Ca_{(2-X)}(In_{(a-b)}B_b)NbO_6:Eu^{2+}_X$; $Ca_{(2-X)}(In_{(a-b)}Al_b)NbO_6:Eu^{2+}_X$;
$Ca_{(2-X)}(In_{(a-b)}Ga_b)NbO_6:Eu^{2+}_X$; $Ca_{(2-X)}(In_{(a-b)}Tl_b)NbO_6:Eu^{2+}_X$;
$Ca_{(2-X)}(In_{(a-b)}Sc_b)NbO_6:Eu^{2+}_X$; $Ca_{(2-X)}(In_{(a-b)}Y_b)NbO_6:Eu^{2+}_X$;
$Ca_{(2-X)}(In_{(a-b)}La_b)NbO_6:Eu^{2+}_X$; $Ca_{(2-X)}(In_{(a-b)}Ce_b)NbO_6:Eu^{2+}_X$;
$Ca_{(2-X)}(In_{(a-b)}Gd_b)NbO_6:Eu^{2+}_X$; $Ca_{(2-X)}(In_{(a-b)}Lu_b)NbO_6:Eu^{2+}_X$;
$Ca_{(2-X)}(In_{(a-b)}B_b)TaO_6:Eu^{2+}_X$; $Ca_{(2-X)}(In_{(a-b)}Al_b)TaO_6:Eu^{2+}_X$;
$Ca_{(2-X)}(In_{(a-b)}Ga_b)TaO_6:Eu^{2+}_X$; $Ca_{(2-X)}(In_{(a-b)}Tl_b)TaO_6:Eu^{2+}_X$;
$Ca_{(2-X)}(In_{(a-b)}Sc_b)TaO_6:Eu^{2+}_X$; $Ca_{(2-X)}(In_{(a-b)}Y_b)TaO_6:Eu^{2+}_X$;
$Ca_{(2-X)}(In_{(a-b)}La_b)TaO_6:Eu^{2+}_X$; $Ca_{(2-X)}(In_{(a-b)}Ce_b)TaO_6:Eu^{2+}_X$;
$Ca_{(2-X)}(In_{(a-b)}Gd_b)TaO_6:Eu^{2+}_X$; $Ca_{(2-X)}(In_{(a-b)}Lu_b)TaO_6:Eu^{2+}_X$;
$Ca_{(2-X)}(In_{(a-b)}B_b)SbO_6:Eu^{2+}_X$; $Ca_{(2-X)}(In_{(a-b)}Al_b)SbO_6:Eu^{2+}_X$;
$Ca_{(2-X)}(In_{(a-b)}Ga_b)SbO_6:Eu^{2+}_X$; $Ca_{(2-X)}(In_{(a-b)}Tl_b)SbO_6:Eu^{2+}_X$;
$Ca_{(2-X)}(In_{(a-b)}Sc_b)SbO_6:Eu^{2+}_X$; $Ca_{(2-X)}(In_{(a-b)}Y_b)SbO_6:Eu^{2+}_X$;
$Ca_{(2-X)}(In_{(a-b)}La_b)SbO_6:Eu^{2+}_X$; $Ca_{(2-X)}(In_{(a-b)}Ce_b)SbO_6:Eu^{2+}_X$;
$Ca_{(2-X)}(In_{(a-b)}Gd_b)SbO_6:Eu^{2+}_X$; $Ca_{(2-X)}(In_{(a-b)}Lu_b)SbO_6:Eu^{2+}_X$;
$Ca_{(2-X)}(In_{(a-b)}B_b)BiO_6:Eu^{2+}_X$; $Ca_{(2-X)}(In_{(a-b)}Al_b)BiO_6:Eu^{2+}_X$;
$Ca_{(2-X)}(In_{(a-b)}Ga_b)BiO_6:Eu^{2+}_X$; $Ca_{(2-X)}(In_{(a-b)}Tl_b)BiO_6:Eu^{2+}_X$;
$Ca_{(2-X)}(In_{(a-b)}Sc_b)BiO_6:Eu^{2+}_X$; $Ca_{(2-X)}(In_{(a-b)}Y_b)BiO_6:Eu^{2+}_X$;
$Ca_{(2-X)}(In_{(a-b)}La_b)BiO_6:Eu^{2+}_X$; $Ca_{(2-X)}(In_{(a-b)}Ce_b)BiO_6:Eu^{2+}_X$;
$Ca_{(2-X)}(In_{(a-b)}Gd_b)BiO_6:Eu^{2+}_X$; $Ca_{(2-X)}(In_{(a-b)}Lu_b)BiO_6:Eu^{2+}_X$;
$Sr_{(2-X)}(In_{(a-b)}B_b)VO_6:Eu^{2+}_X$; $Sr_{(2-X)}(In_{(a-b)}Al_b)VO_6:Eu^{2+}_X$;
$Sr_{(2-X)}(In_{(a-b)}Ga_b)VO_6:Eu^{2+}_X$; $Sr_{(2-X)}(In_{(a-b)}Tl_b)VO_6:Eu^{2+}_X$;
$Sr_{(2-X)}(In_{(a-b)}Sc_b)VO_6:Eu^{2+}_X$; $Sr_{(2-X)}(In_{(a-b)}Y_b)VO_6:Eu^{2+}_X$;
$Sr_{(2-X)}(In_{(a-b)}La_b)VO_6:Eu^{2+}_X$; $Sr_{(2-X)}(In_{(a-b)}Ce_b)VO_6:Eu^{2+}_X$;
$Sr_{(2-X)}(In_{(a-b)}Gd_b)VO_6:Eu^{2+}_X$; $Sr_{(2-X)}(In_{(a-b)}Lu_b)VO_6:Eu^{2+}_X$;
$Sr_{(2-X)}(In_{(a-b)}B_b)NbO_6:Eu^{2+}_X$; $Sr_{(2-X)}(In_{(a-b)}Al_b)NbO_6:Eu^{2+}_X$;
$Sr_{(2-X)}(In_{(a-b)}Ga_b)NbO_6:Eu^{2+}_X$; $Sr_{(2-X)}(In_{(a-b)}Tl_b)NbO_6:Eu^{2+}_X$;
$Sr_{(2-X)}(In_{(a-b)}Sc_b)NbO_6:Eu^{2+}_X$; $Sr_{(2-X)}(In_{(a-b)}Y_b)NbO_6:Eu^{2+}_X$;
$Sr_{(2-X)}(In_{(a-b)}La_b)NbO_6:Eu^{2+}_X$; $Sr_{(2-X)}(In_{(a-b)}Ce_b)NbO_6:Eu^{2+}_X$;
$Sr_{(2-X)}(In_{(a-b)}Gd_b)NbO_6:Eu^{2+}_X$; $Sr_{(2-X)}(In_{(a-b)}Lu_b)NbO_6:Eu^{2+}_X$;
$Sr_{(2-X)}(In_{(a-b)}B_b)TaO_6:Eu^{2+}_X$; $Sr_{(2-X)}(In_{(a-b)}Al_b)TaO_6:Eu^{2+}_X$;
$Sr_{(2-X)}(In_{(a-b)}Ga_b)TaO_6:Eu^{2+}_X$; $Sr_{(2-X)}(In_{(a-b)}Tl_b)TaO_6:Eu^{2+}_X$;
$Sr_{(2-X)}(In_{(a-b)}Sc_b)TaO_6:Eu^{2+}_X$; $Sr_{(2-X)}(In_{(a-b)}Y_b)TaO_6:Eu^{2+}_X$;
$Sr_{(2-X)}(In_{(a-b)}La_b)TaO_6:Eu^{2+}_X$; $Sr_{(2-X)}(In_{(a-b)}Ce_b)TaO_6:Eu^{2+}_X$;
$Sr_{(2-X)}(In_{(a-b)}Gd_b)TaO_6:Eu^{2+}_X$; $Sr_{(2-X)}(In_{(a-b)}Lu_b)TaO_6:Eu^{2+}_X$;
$Sr_{(2-X)}(In_{(a-b)}B_b)SbO_6:Eu^{2+}_X$; $Sr_{(2-X)}(In_{(a-b)}Al_b)SbO_6:Eu^{2+}_X$;
$Sr_{(2-X)}(In_{(a-b)}Ga_b)SbO_6:Eu^{2+}_X$; $Sr_{(2-X)}(In_{(a-b)}Tl_b)SbO_6:Eu^{2+}_X$;
$Sr_{(2-X)}(In_{(a-b)}Sc_b)SbO_6:Eu^{2+}_X$; $Sr_{(2-X)}(In_{(a-b)}Y_b)SbO_6:Eu^{2+}_X$;
$Sr_{(2-X)}(In_{(a-b)}La_b)SbO_6:Eu^{2+}_X$; $Sr_{(2-X)}(In_{(a-b)}Ce_b)SbO_6:Eu^{2+}_X$;
$Sr_{(2-X)}(In_{(a-b)}Gd_b)SbO_6:Eu^{2+}_X$; $Sr_{(2-X)}(In_{(a-b)}Lu_b)SbO_6:Eu^{2+}_X$;
$Sr_{(2-X)}(In_{(a-b)}B_b)BiO_6:Eu^{2+}_X$; $Sr_{(2-X)}(In_{(a-b)}Al_b)BiO_6:Eu^{2+}_X$;
$Sr_{(2-X)}(In_{(a-b)}Ga_b)BiO_6:Eu^{2+}_X$; $Sr_{(2-X)}(In_{(a-b)}Tl_b)BiO_6:Eu^{2+}_X$;
$Sr_{(2-X)}(In_{(a-b)}Sc_b)BiO_6:Eu^{2+}_X$; $Sr_{(2-X)}(In_{(a-b)}Y_b)BiO_6:Eu^{2+}_X$;
$Sr_{(2-X)}(In_{(a-b)}La_b)BiO_6:Eu^{2+}_X$; $Sr_{(2-X)}(In_{(a-b)}Ce_b)BiO_6:Eu^{2+}_X$;
$Sr_{(2-X)}(In_{(a-b)}Gd_b)BiO_6:Eu^{2+}_X$; $Sr_{(2-X)}(In_{(a-b)}Lu_b)BiO_6:Eu^{2+}_X$;
$Ba_{(2-X)}(In_{(a-b)}B_b)VO_6:Eu^{2+}_X$; $Ba_{(2-X)}(In_{(a-b)}Al_b)VO_6:Eu^{2+}_X$;
$Ba_{(2-X)}(In_{(a-b)}Ga_b)VO_6:Eu^{2+}_X$; $Ba_{(2-X)}(In_{(a-b)}Tl_b)VO_6:Eu^{2+}_X$;
$Ba_{(2-X)}(In_{(a-b)}Sc_b)VO_6:Eu^{2+}_X$; $Ba_{(2-X)}(In_{(a-b)}Y_b)VO_6:Eu^{2+}_X$;
$Ba_{(2-X)}(In_{(a-b)}La_b)VO_6:Eu^{2+}_X$; $Ba_{(2-X)}(In_{(a-b)}Ce_b)VO_6:Eu^{2+}_X$;
$Ba_{(2-X)}(In_{(a-b)}Gd_b)VO_6:Eu^{2+}_X$; $Ba_{(2-X)}(In_{(a-b)}Lu_b)VO_6:Eu^{2+}_X$;
$Ba_{(2-X)}(In_{(a-b)}B_b)NbO_6:Eu^{2+}_X$; $Ba_{(2-X)}(In_{(a-b)}Al_b)NbO_6:Eu^{2+}_X$;

$Ba_{(2-X)}(In_{(a-b)}Ga_b)NbO_6:Eu^{2+}_X$; $Ba_{(2-X)}(In_{(a-b)}Tl_b)NbO_6:Eu^{2+}_X$;
$Ba_{(2-X)}(In_{(a-b)}Sc_b)NbO_6:Eu^{2+}_X$; $Ba_{(2-X)}(In_{(a-b)}Y_b)NbO_6:Eu^{2+}_X$;
$Ba_{(2-X)}(In_{(a-b)}La_b)NbO_6:Eu^{2+}_X$; $Ba_{(2-X)}(In_{(a-b)}Ce_b)NbO_6:Eu^{2+}_X$;
$Ba_{(2-X)}(In_{(a-b)}Gd_b)NbO_6:Eu^{2+}_X$; $Ba_{(2-X)}(In_{(a-b)}Lu_b)NbO_6:Eu^{2+}_X$;
$Ba_{(2-X)}(In_{(a-b)}B_b)TaO_6:Eu^{2+}_X$; $Ba_{(2-X)}(In_{(a-b)}Al_b)TaO_6:Eu^{2+}_X$;
$Ba_{(2-X)}(In_{(a-b)}Ga_b)TaO_6:Eu^{2+}_X$; $Ba_{(2-X)}(In_{(a-b)}Tl_b)TaO_6:Eu^{2+}_X$;
$Ba_{(2-X)}(In_{(a-b)}Sc_b)TaO_6:Eu^{2+}_X$; $Ba_{(2-X)}(In_{(a-b)}Y_b)TaO_6:Eu^{2+}_X$;
$Ba_{(2-X)}(In_{(a-b)}La_b)TaO_6:Eu^{2+}_X$; $Ba_{(2-X)}(In_{(a-b)}Ce_b)TaO_6:Eu^{2+}_X$;
$Ba_{(2-X)}(In_{(a-b)}Gd_b)TaO_6:Eu^{2+}_X$; $Ba_{(2-X)}(In_{(a-b)}Lu_b)TaO_6:Eu^{2+}_X$;
$Ba_{(2-X)}(In_{(a-b)}B_b)SbO_6:Eu^{2+}_X$; $Ba_{(2-X)}(In_{(a-b)}Al_b)SbO_6:Eu^{2+}_X$;
$Ba_{(2-X)}(In_{(a-b)}Ga_b)SbO_6:Eu^{2+}_X$; $Ba_{(2-X)}(In_{(a-b)}Tl_b)SbO_6:Eu^{2+}_X$;
$Ba_{(2-X)}(In_{(a-b)}Sc_b)SbO_6:Eu^{2+}_X$; $Ba_{(2-X)}(In_{(a-b)}Y_b)SbO_6:Eu^{2+}_X$;
$Ba_{(2-X)}(In_{(a-b)}La_b)SbO_6:Eu^{2+}_X$; $Ba_{(2-X)}(In_{(a-b)}Ce_b)SbO_6:Eu^{2+}_X$;
$Ba_{(2-X)}(In_{(a-b)}Gd_b)SbO_6:Eu^{2+}_X$; $Ba_{(2-X)}(In_{(a-b)}Lu_b)SbO_6:Eu^{2+}_X$;
$Ba_{(2-X)}(In_{(a-b)}B_b)BiO_6:Eu^{2+}_X$; $Ba_{(2-X)}(In_{(a-b)}Al_b)BiO_6:Eu^{2+}_X$;
$Ba_{(2-X)}(In_{(a-b)}Ga_b)BiO_6:Eu^{2+}_X$; $Ba_{(2-X)}(In_{(a-b)}Tl_b)BiO_6:Eu^{2+}_X$;
$Ba_{(2-X)}(In_{(a-b)}Sc_b)BiO_6:Eu^{2+}_X$; $Ba_{(2-X)}(In_{(a-b)}Y_b)BiO_6:Eu^{2+}_X$;
$Ba_{(2-X)}(In_{(a-b)}La_b)BiO_6:Eu^{2+}_X$; $Ba_{(2-X)}(In_{(a-b)}Ce_b)BiO_6:Eu^{2+}_X$;
$Ba_{(2-X)}(In_{(a-b)}Gd_b)BiO_6:Eu^{2+}_X$; $Ba_{(2-X)}(In_{(a-b)}Lu_b)BiO_6:Eu^{2+}_X$;
$Zn_{(2-X)}(In_{(a-b)}B_b)VO_6:Eu^{2+}_X$; $Zn_{(2-X)}(In_{(a-b)}Al_b)VO_6:Eu^{2+}_X$;
$Zn_{(2-X)}(In_{(a-b)}Ga_b)VO_6:Eu^{2+}_X$; $Zn_{(2-X)}(In_{(a-b)}Tl_b)VO_6:Eu^{2+}_X$;
$Zn_{(2-X)}(In_{(a-b)}Sc_b)VO_6:Eu^{2+}_X$; $Zn_{(2-X)}(In_{(a-b)}Y_b)VO_6:Eu^{2+}_X$;
$Zn_{(2-X)}(In_{(a-b)}La_b)VO_6:Eu^{2+}_X$; $Zn_{(2-X)}(In_{(a-b)}Ce_b)VO_6:Eu^{2+}_X$;
$Zn_{(2-X)}(In_{(a-b)}Gd_b)VO_6:Eu^{2+}_X$; $Zn_{(2-X)}(In_{(a-b)}Lu_b)VO_6:Eu^{2+}_X$;
$Zn_{(2-X)}(In_{(a-b)}B_b)NbO_6:Eu^{2+}_X$; $Zn_{(2-X)}(In_{(a-b)}Al_b)NbO_6:Eu^{2+}_X$;
$Zn_{(2-X)}(In_{(a-b)}Ga_b)NbO_6:Eu^{2+}_X$; $Zn_{(2-X)}(In_{(a-b)}Tl_b)NbO_6:Eu^{2+}_X$;
$Zn_{(2-X)}(In_{(a-b)}Sc_b)NbO_6:Eu^{2+}_X$; $Zn_{(2-X)}(In_{(a-b)}Y_b)NbO_6:Eu^{2+}_X$;
$Zn_{(2-X)}(In_{(a-b)}La_b)NbO_6:Eu^{2+}_X$; $Zn_{(2-X)}(In_{(a-b)}Ce_b)NbO_6:Eu^{2+}_X$;
$Zn_{(2-X)}(In_{(a-b)}Gd_b)NbO_6:Eu^{2+}_X$; $Zn_{(2-X)}(In_{(a-b)}Lu_b)NbO_6:Eu^{2+}_X$;
$Zn_{(2-X)}(In_{(a-b)}B_b)TaO_6:Eu^{2+}_X$; $Zn_{(2-X)}(In_{(a-b)}Al_b)TaO_6:Eu^{2+}_X$;
$Zn_{(2-X)}(In_{(a-b)}Ga_b)TaO_6:Eu^{2+}_X$; $Zn_{(2-X)}(In_{(a-b)}Tl_b)TaO_6:Eu^{2+}_X$;
$Zn_{(2-X)}(In_{(a-b)}Sc_b)TaO_6:Eu^{2+}_X$; $Zn_{(2-X)}(In_{(a-b)}Y_b)TaO_6:Eu^{2+}_X$;
$Zn_{(2-X)}(In_{(a-b)}La_b)TaO_6:Eu^{2+}_X$; $Zn_{(2-X)}(In_{(a-b)}Ce_b)TaO_6:Eu^{2+}_X$;
$Zn_{(2-X)}(In_{(a-b)}Gd_b)TaO_6:Eu^{2+}_X$; $Zn_{(2-X)}(In_{(a-b)}Lu_b)TaO_6:Eu^{2+}_X$;
$Zn_{(2-X)}(In_{(a-b)}B_b)SbO_6:Eu^{2+}_X$; $Zn_{(2-X)}(In_{(a-b)}Al_b)SbO_6:Eu^{2+}_X$;
$Zn_{(2-X)}(In_{(a-b)}Ga_b)SbO_6:Eu^{2+}_X$; $Zn_{(2-X)}(In_{(a-b)}Tl_b)SbO_6:Eu^{2+}_X$;
$Zn_{(2-X)}(In_{(a-b)}Sc_b)SbO_6:Eu^{2+}_X$; $Zn_{(2-X)}(In_{(a-b)}Y_b)SbO_6:Eu^{2+}_X$;
$Zn_{(2-X)}(In_{(a-b)}La_b)SbO_6:Eu^{2+}_X$; $Zn_{(2-X)}(In_{(a-b)}Ce_b)SbO_6:Eu^{2+}_X$;
$Zn_{(2-X)}(In_{(a-b)}Gd_b)SbO_6:Eu^{2+}_X$; $Zn_{(2-X)}(In_{(a-b)}Lu_b)SbO_6:Eu^{2+}_X$;
$Zn_{(2-X)}(In_{(a-b)}B_b)BiO_6:Eu^{2+}_X$; $Zn_{(2-X)}(In_{(a-b)}Al_b)BiO_6:Eu^{2+}_X$;
$Zn_{(2-X)}(In_{(a-b)}Ga_b)BiO_6:Eu^{2+}_X$; $Zn_{(2-X)}(In_{(a-b)}Tl_b)BiO_6:Eu^{2+}_X$;
$Zn_{(2-X)}(In_{(a-b)}Sc_b)BiO_6:Eu^{2+}_X$; $Zn_{(2-X)}(In_{(a-b)}Y_b)BiO_6:Eu^{2+}_X$;
$Zn_{(2-X)}(In_{(a-b)}La_b)BiO_6:Eu^{2+}_X$; $Zn_{(2-X)}(In_{(a-b)}Ce_b)BiO_6:Eu^{2+}_X$;
$Zn_{(2-X)}(In_{(a-b)}Gd_b)BiO_6:Eu^{2+}_X$ or $Zn_{(2-X)}(In_{(a-b)}Lu_b)BiO_6:Eu^{2+}_X$.

More preferably, the compounds according to the present invention are selected from the group of compounds of formulae Ia-1 wherein b is 0.

Preferably they are selected the group of compounds of formulae Ia-1, wherein $M^1$ denotes In wherein b is 0 and $M^1$ denotes In.

Especially preferred compounds are selected from the group of compounds of formulae I, Ia, or Ia-1, preferably wherein $M^{III}$ denotes In, and wherein $M^{II}$ denotes at least one bivalent element selected from Be, Mg, Ca, Sr, Ba and/or Zn, preferably selected from Sr, Ca, and/or Ba, even more preferably $M^{II}$ denotes Sr.

Particularly, the preferred compounds are selected from the group of compounds of formulae I, Ia, or Ia-1, preferably wherein $M^{III}$ denotes In, and wherein $M^V$ denotes at least one pentavalent element selected from V, Nb, Ta, As, Sb, and/or Bi, more preferably selected from Ta, V, Nb, and/or Sb, even more preferably selected from Nb and/or Ta.

More particularly, the preferred compounds are selected from the following subformulae, $Be_{(2-X)}InVO_6:Eu^{2+}_X$, $Mg_{(2-X)}InVO_6:Eu^{2+}_X$, $Ca_{(2-X)}InVO_6:Eu^{2+}_X$, $Sr_{(2-X)}InVO_6:Eu^{2+}_X$, $Ba_{(2-X)}InVO_6:Eu^{2+}_X$, $Be_{(2-X)}InNbO_6:Eu^{2+}_X$, $Mg_{(2-X)}InNbO_6:Eu^{2+}_X$, $Ca_{(2-X)}InNbO_6:Eu^{2+}_X$, $Sr_{(2-X)}InNbO_6:Eu^{2+}_X$, $Ba_{(2-X)}InNbO_6:Eu^{2+}_X$, $Be_{(2-X)}InTaO_6:Eu^{2+}_X$, $Mg_{(2-X)}InTaO_6:Eu^{2+}_X$, $Ca_{(2-X)}InTaO_6:Eu^{2+}_X$, $Sr_{(2-X)}InTaO_6:Eu^{2+}_X$, $Ba_{(2-X)}InTaO_6:Eu^{2+}_X$, $Be_{(2-X)}InSbO_6:Eu^{2+}_X$, $Mg_{(2-X)}InSbO_6:Eu^{2+}_X$, $Ca_{(2-X)}InSbO_6:Eu^{2+}_X$, $Sr_{(2-X)}InSbO_6:Eu^{2+}_X$, $Ba_{(2-X)}InSbO_6:Eu^{2+}_X$, $Be_{(2-X)}InBiO_6:Eu^{2+}_X$, $Mg_{(2-X)}InBiO_6:Eu^{2+}_X$, $Ca_{(2-X)}InBiO_6:Eu^{2+}_X$, $Sr_{(2-X)}InBiO_6:Eu^{2+}_X$, or $Ba_{(2-X)}InBiO_6:Eu^{2+}_X$.

Most preferred compounds are selected from the group of compounds of formulae Ia and Ia-1 wherein $0<x<0.3$, preferably $0.03 \leq x < 0.2$, more preferably $0.05 \leq x < 0.1$.

Preferably, the compounds according to the present invention are typically excited by artificial or natural radiation sources exciting radiation having a wavelength ranging from approximately 300 nm to approximately 525 nm.

Preferably, the compounds according to the present invention typically emit radiation having a wavelength ranging from approximately 475 nm to approximately 725 nm.

The compounds according to present invention are especially suitable to convert all or at least some parts of the radiation having a wavelength ranging from approximately 300 nm to approximately 500 nm, preferably of the radiation having a wavelength ranging from approximately 400 nm to approximately 500 nm, into radiation having a longer wavelength, preferably into radiation having a wavelength ranging from approximately 500 nm to approximately 800 nm, more preferably into radiation having a wavelength ranging from approximately 500 nm to approximately 700 nm.

In the context of the present application the term "UV radiation" has the meaning of electromagnetic radiation having a wavelength ranging from approximately 100 nm to approximately 400 nm, unless explicitly stated otherwise.

Additionally, the term "near UV radiation", has the meaning of electromagnetic radiation in the range of UV radiation having a wavelength ranging from approximately 300 nm to approximately 400 nm, unless explicitly stated otherwise.

Moreover, the term "VIS light or VIS-light region" has the meaning of electromagnetic radiation having a wavelength ranging from approximately 400 nm to approximately 800 nm unless explicitly stated otherwise.

The term "blue radiation" refers to a wavelength between 400 nm and 500 nm.

Thus, the present invention relates also to the use of compounds of formulae I, Ia, and Ia-1 as conversion phosphors, or short "phosphors".

In the context of the present application, the term "conversion phosphor" and the term "phosphor" are used in the same manner.

Suitable artificial "radiation sources" or "light sources" are commonly known to the expert and will be explained in more detail below.

In the context of the present application, the term "natural radiation sources" means solar irradiation or sunlight.

It is preferred that the emissions spectra of the radiation sources and the absorption spectra of the compounds according to the present invention overlap more than 10 area percent, preferable more than 30 area percent, more preferable more than 60 area percent, and most preferable more than 90 area percent.

The term "absorption" means the absorbance of a material, which corresponds to the logarithmic ratio of the radiation falling upon a material, to the radiation transmitted through a material.

The term "emission" means the emission of electromagnetic waves by electron transitions in atoms and molecules.

Preferably, the phosphors according to the present invention exhibit at least one emission peak in the VIS light region, while being excited by light having a wavelength ranging from approximately 300 nm to approximately 500 nm. Preferably, the main emission peak has its emission maximum between about 500 nm and about 700 nm, more preferably between about 525 nm and about 650 nm.

By varying the composition of the compounds of formulae I, Ia, and Ia-1, especially regarding the parameter $M^{II}$, it is possible to specifically vary the emission properties. For example, gradual substitution of Sr by Ba leads to an emission having a shorter wavelength, while gradual substitution of Sr by Ca leads to an emission having a longer wavelength.

The compounds according to the present invention preferably exhibit at least one emission peak in the VIS light region, having a FWHM of at least 50 nm or more, preferably 75 nm or more, more preferably 100 nm or more, and most preferably of at least 125 nm or more.

The full width at half maximum (FWHM) is a parameter commonly used to describe the width of a "peak" on a curve or function. It is given by the distance between points on the curve at which the function reaches half its maximum value.

As known to the skilled person, the quantum efficiency of a phosphor decreases as the phosphor size decreases. Preferably, the phosphor exhibits quantum efficiency of at least 80% and more preferably of at least 90%.

The particle size of suitable phosphors particles typically ranges from approximately 50 nm to approximately 100 µm, more preferably from approximately 50 nm to approximately 50 µm, and even more preferably from approximately 50 nm to approximately 25 µm.

The particle size can be unambiguously and quantitatively defined by its diameter. It can be determined by methods known to the skilled artisan such as, for example, dynamic light scattering or static light scattering Working temperatures in LED applications are typically about 150° C. Preferably, the compounds according to the present invention exhibit high thermal quenching resistivity up to about 100° C. or more, more preferably up to about 150° C. or more, and even more preferably up to about 200° C. or more.

The term "thermal quenching resistivity" means an emission intensity decrease at higher temperature compared to an original intensity at 25° C.

The compounds of formulae I, Ia, and Ia-1, of the present invention, are further characterized by their high chemical stability. Thus, the compounds of formulae I, Ia, and Ia-1, are resistant to oxidation and hydrolysis.

The starting materials for the preparation of the compounds according to the present invention are commercially available and suitable processes for the preparation of the compounds according to the present invention can be summarized in two general process classes:

first, a solid-state diffusion process, and
secondly, a wet-chemical process.

In the context of the present application, the term "solid state diffusion process" refers to any mixing and firing method or solid-phase method, comprising the steps a) mixing at least one salt containing Eu, one or more salts comprising at least one element selected from of Be, Mg, Ca, Sr, Ba, and Zn, one or more salts comprising at least one element selected from B, Al, Ga, In, Tl, Sc, Y, La, Ce, Gd, and Lu, one or more salts comprising at least one element selected from V, Nb, Ta, As, Sb, and Bi, at a predetermined molar ratio, b) optionally grinding the mixture, c) performing a primary heat treatment on the mixture in a temperature range of 800 to 1300° C. under an oxidative atmosphere; and d) performing a secondary heat treatment on the mixture in a temperature range of 1200 to 1700° C. under a reductive atmosphere.

Generally, suitable salts of the elements $M^{II}$, $M^{III}$, $M^V$ and europium are preferably selected from corresponding oxides, halides, hydrogensulfates or carbonates, more preferably carbonates, oxides or halides, in particular chlorides.

Above and below, the term "reductive atmosphere" means an atmosphere having reductive properties, preferably an atmosphere of carbon monoxide, forming gas or hydrogen or at least vacuum or an oxygen-deficient atmosphere, preferably in a stream of argon, hydrogen, nitrogen or any mixtures thereof.

Above and below, the term "oxidative atmosphere" has the meaning of an atmosphere having oxidizing properties, preferably atmosphere of air or oxygen.

In the context of the present application, the term "wet-chemical process" preferably comprises the following steps:

a) mixing at least one salt containing Eu, one or more salts comprising at least one element selected from of Be, Mg, Ca, Sr, Ba, and Zn, one or more salts comprising at least one element selected from B, Al, Ga, In, Tl, Sc, Y, La, Ce, Gd, and Lu, one or more salts comprising at least one element selected from V, Nb, Ta, As, Sb, and Bi, at a predetermined molar ratio in a suitable solvent;

b) adding a precipitation agent;

c) performing a primary heat treatment on the mixture in a temperature range of 800 to 1300° C. under an oxidative atmosphere; and d) performing a secondary heat treatment on the mixture in a temperature range of 1200 to 1700° C. under a reductive atmosphere.

Step a) of the "wet-chemical process" is preferably performed in a micro reactor, a small confined area of a flow channel with an internal diameter ranging from 1 mm to 10 mm width, wherein two or more solutions are mixed through said flow channel. In the micro reactor, chemical reactions of the mixed solutions take place in a confinement with typical lateral dimensions below a few millimeters.

For the preparation of the mixture in step a) of the "wet-chemical process", it is possible to prepare a mixture of some or all of the salts or components as powders and adding the solvent or to prepare the mixture stepwise directly in a solvent. However, the above-mentioned salts can be added to the mixture at any time before the precipitation step (before step b).

The term "solvent" is taken to mean a solvent that does not necessarily dissolve the salts. Water and alcohols, such as methanol, ethanol, etc. are preferred solvents in accordance with the present invention.

Also here, suitable salts of the elements $M^{II}$, $M^{III}$, $M^{V}$ and europium are preferably selected from corresponding oxides, halogenides, hydrogensulfates or carbonates, more preferably carbonates, oxides or halogenides, in particular chlorides.

Preferred precipitation agents in step b) of the "wet-chemical process" are selected from sodium hydrogen carbonate, ammonium chloride, or ammonium hydrogen carbonate, more preferably the precipitation agent is ammonium chloride.

In a preferred embodiment of the invention, the precipitation agents are added in suitable solvents and preferably mixed with the solvents at temperatures above the melting point of the corresponding solvent and below the boiling point of the solvent. More preferably in a temperature range up to about 70° C., even more preferably up to about 60° C., and preferably for at least 1 h or more, more preferably for at least 2 hours or more.

In a preferred embodiment of the present invention, a pre-heat treatment step can optionally be performed after performing step b) of the "wet-chemical process" and before performing step c), in order to evaporate the solvent from the mixture of step b). As commonly known by the expert, suitable temperature conditions depends mainly on the used solvent. However, preferred temperature conditions range up to 100° C., more preferably up to 90° C. and even more preferably up to 80° C.

A suitable evaporation atmosphere is not particularly limited to any particular conditions regarding pressure or atmosphere. However, preferably, the evaporation of the solvent is performed under an air atmosphere but also applying reduced pressure conditions is applicable in the sense of the present application.

In both described processes and especially with respect to step c), an annealing oven, as known to the expert, is preferably driven under an oxidative atmosphere. In a further preferred embodiment of the invention, a commonly known oxidation furnace is used in the step c).

In both described processes and especially with respect to step d), an annealing oven, as known to the expert, is preferably driven under a reductive atmosphere. In a further preferred embodiment of the invention, a commonly known reducing furnace is used in the step d).

In both described processes, the final product can optionally be grounded and/or sieved.

In a further preferred embodiment, the phosphors in particle form have a continuous surface coating consisting of $SiO_2$, $TiO_2$, $Al_2O_3$, $ZnO$, $ZrO_2$ and/or $Y_2O_3$ or mixed oxides thereof. This surface coating has the advantage that, through a suitable grading of the refractive indices of the coating materials, the refractive index can be matched to the environment. In this case, the scattering of light at the surface of the phosphor is reduced and a greater proportion of the light can penetrate into the phosphor and be absorbed and converted therein. In addition, the refractive index-matched surface coating enables more light to be coupled out of the phosphor since total internal reflection is reduced.

In addition, a continuous layer is advantageous if the phosphor has to be encapsulated. This may be necessary in order to counter sensitivity of the phosphor or parts thereof to diffusing water or other materials in the immediate environment. A further reason for encapsulation with a closed shell is thermal decoupling of the actual phosphor from the heat generated in the chip. This heat results in a reduction in the fluorescence light yield of the phosphor and may also influence the colour of the fluorescence light. Finally, a coating of this type enables the efficiency of the phosphor to be increased by preventing lattice vibrations arising in the phosphor from propagating to the environment.

In addition, it is preferred for the phosphors to have a porous surface coating consisting of $SiO_2$, $TiO_2$, $Al_2O_3$, $ZnO$, $ZrO_2$ and/or $Y_2O_3$ or mixed oxides thereof or of the phosphor composition. These porous coatings offer the possibility of further reducing the refractive index of a single layer. Porous coatings of this type can be produced by three conventional methods, as described e.g. in WO 03/027015, which is incorporated in its full scope into the context of the present application by way of reference: the etching of glass (for example soda-lime glasses (see U.S. Pat. No. 4,019,884)), the application of a porous layer, and the combination of a porous layer and an etching operation.

In a further preferred embodiment, the phosphor particles have a surface which carries functional groups which facilitate chemical bonding to the environment, preferably consisting of epoxy or silicone resin. These functional groups can be, for example, esters or other derivatives which are bonded via oxo groups and are able to form links to constituents of the binders based on epoxides and/or silicones. Surfaces of this type have the advantage that homogeneous incorporation of the phosphors into the binder is facilitated. Furthermore, the rheological properties of the phosphor/binder system and also the pot lives can thereby be adjusted to a certain extent. Processing of the mixtures is thus simplified.

Since the phosphor layer according to the invention applied to the LED chip preferably consists of a mixture of silicone and homogeneous phosphor particles which is applied by bulk casting, and the silicone has a surface tension, this phosphor layer is not uniform at a microscopic level or the thickness of the layer is not constant throughout. This is generally also the case if the phosphor is not applied by the bulk-casting process, but instead in the so-called chip-level conversion process, in which a highly concentrated, thin phosphor layer is applied directly to the surface of the chip with the aid of electrostatic methods.

With the aid of the above-mentioned process, it is possible to produce any desired outer shapes of the phosphor particles, such as spherical particles, flakes and structured materials and ceramics.

The preparation of flake-form phosphors as a further preferred embodiment is carried out by conventional processes from the corresponding metal salts and/or rare-earth salts. The preparation process is described in detail in EP 763573 and DE 102006054331, which are incorporated in their full scope into the context of the present application by way of reference. These flake-form phosphors can be prepared by coating a natural or synthetically prepared, highly stable support or a substrate comprising, for example, mica, $SiO_2$, $Al_2O_3$, $ZrO_2$, glass or $TiO_2$ flakes which has a very large aspect ratio, an atomically smooth surface and an adjustable thickness with a phosphor layer by a precipitation reaction in aqueous dispersion or suspension. Besides mica, $ZrO_2$, $SiO_2$, $Al_2O_3$, glass or $TiO_2$ or mixtures thereof, the flakes may also consist of the phosphor material itself or be built up from one material. If the flake itself merely serves as support for the phosphor coating, the latter must consist of a material which is transparent to the primary radiation of the LED, or absorbs the primary radiation and transfers this energy to the phosphor layer. The flake-form phosphors are dispersed in a resin (for example silicone or epoxy resin), and this dispersion is applied to the LED chip. The flake-form phosphors can be prepared on a large industrial scale in thicknesses of 50 nm to about 20 μm, preferably between 150 nm and 5 μm. The diameter here is 50 nm to 20 μm.

It generally has an aspect ratio (ratio of the diameter to the particle thickness) of 1:1 to 400:1 and in particular 3:1 to 100:1.

The flake dimensions (length×width) are dependent on the arrangement. Flakes are also suitable as centres of scattering within the conversion layer, in particular if they have particularly small dimensions.

The surface of the flake-form phosphor according to the invention facing the LED chip can be provided with a coating which has an antireflection action with respect to the primary radiation emitted by the LED chip. This results in a reduction in back-scattering of the primary radiation, enabling the latter to be coupled better into the phosphor body according to the invention.

Suitable for this purpose are, for example, coatings of matched refractive index, which must have a following thickness d: d=[wavelength of the primary radiation of the LED chip/(4*refractive index of the phosphor ceramic)], see, for example, Gerthsen, Physik [Physics], Springer Verlag, 18th Edition, 1995. This coating may also consist of photonic crystals, which also includes structuring of the surface of the flake-form phosphor in order to achieve certain functionalities.

The production of the phosphors according to the invention in the form of ceramic bodies is carried out analogously to the process described in DE 102006037730 (Merck), which is incorporated in its full scope into the context of the present application by way of reference. In this process, the phosphor is prepared by wet-chemical methods by mixing the corresponding starting materials and dopants, subsequently subjected to isostatic pressing and applied directly to the surface of the chip in the form of a homogeneous, thin and non-porous flake. There is thus no location-dependent variation of the excitation and emission of the phosphor, which means that the LED provided therewith emits a homogeneous light cone of constant colour and has high light output. The ceramic phosphor bodies can be produced on a large industrial scale, for example, as flakes in thicknesses of a few 100 nm to about 500 μm. The flake dimensions (length×width) are dependent on the arrangement. In the case of direct application to the chip, the size of the flake should be selected in accordance with the chip dimensions (from about 100 μm*100 μm to several $mm^2$) with a certain oversize of about 10% to 30% of the chip surface with a suitable chip arrangement (for example flip-chip arrangement) or correspondingly. If the phosphor flake is installed over a finished LED, the entire exiting light cone passes through the flake.

The side surfaces of the ceramic phosphor body can be coated with a light metal or noble metal, preferably aluminium or silver. The metal coating has the effect that light does not exit laterally from the phosphor body. Light exiting laterally can reduce the luminous flux to be coupled out of the LED. The metal coating of the ceramic phosphor body is carried out in a process step after the isostatic pressing to give rods or flakes, where the rods or flakes can optionally be cut to the requisite size before the metal coating. To this end, the side surfaces are wetted, for example, with a solution comprising silver nitrate and glucose and subsequently exposed to an ammonia atmosphere at elevated temperature. A silver coating, for example, forms on the side surfaces in the process.

Alternatively, current less metallisation processes are also suitable, see, for example, Hollemann-Wiberg, Lehrbuch der Anorganischen Chemie [Textbook of Inorganic Chemistry], Walter de Gruyter Verlag or Ullmanns Enzyklopädie der chemischen Technologie [Ullmann's Encyclopaedia of Chemical Technology].

The ceramic phosphor body can, if necessary, be fixed to the baseboard of an LED chip using a water-glass solution.

In a further embodiment, the ceramic phosphor body has a structured (for example pyramidal) surface on the side opposite an LED chip. This enables as much light as possible to be coupled out of the phosphor body. The structured surface on the phosphor body is produced by carrying out the isostatic pressing using a compression mould having a structured pressure plate and thus embossing a structure into the surface. Structured surfaces are desired if the aim is to produce the thinnest possible phosphor bodies or flakes. The pressing conditions are known to the person skilled in the art (see J. Kriegsmann, Technische keramische Werkstoffe [Industrial Ceramic Materials], Chapter 4, Deutscher Wirtschaftsdienst, 1998). It is important that the pressing temperatures used are ⅔ to ⅚ of the melting point of the substance to be pressed.

The compounds of the present invention are of good LED quality. In the context of this application, the LED quality is determined by commonly known parameters, such as the color rendering index (CRI), the Correlated Color Temperature (CCT), the lumen equivalent or absolute lumen, and the color point in CIE x and y coordinates.

The Color Rendering Index (CRI), as known to the expert, is a unit less photometric size, which compares the color fidelity of an artificial light source to that of sunlight or filament light sources (the latter two have a CRI of 100).

The Correlated Color Temperature (CCT), as known to the expert, is a photometric variable having the unit Kelvin. The higher the number, the greater the blue component of the light and the colder the white light of an artificial light source appears to the viewer. The CCT follows the concept of the black light blue lamp, which color temperature describes the so-called Planck's curve in the CIE diagram.

The lumen equivalent, as known to the expert, is a photometric variable having the unit the lm/W. The lumen equivalent describes the size of the photometric luminous flux of a light source at a specific radiometric radiation power having the unit is watts. The higher the lumen equivalent is, the more efficient is a light source.

The lumen, as known to the expert, is photometric variable, which describes the luminous flux of a light source, which is a measure of the total radiation emitted by a light source in the VIS region. The greater the light output, the brighter the light source appears to the observer.

CIE x and CIE y are the coordinates of the CIE chromaticity diagram (here 1931 standard observer), which describes the color of a light source.

All of the above variables can be calculated from the emission spectra of the light source by methods known to the expert.

The phosphors according to the present invention can be used as obtained or in a mixture with other phosphors. Accordingly, the present invention also relates to an emission-converting material comprising one or more compounds according to the present invention.

Suitable phosphors for a mixture or an emission-converting material according to the present invention are for example:

$Ba_2SiO_4:Eu^{2+}$, $BaSi_2O_5:Pb^{2+}$, $Ba_xSr_{1-x}F_2:Eu^{2+}$, $BaSrMgSi_2O_7:Eu^{2+}$, $BaTiP_2O_7$, $(Ba,Ti)_2P_2O_7:Ti$, $Ba_3WO_6:U$, $BaY_2F_8:Er^{3+}$, $Yb^+$, $Be_2SiO_4:Mn^{2+}$, $Bi_4Ge_3O_{12}$, $CaAl_2O_4:Ce^{3+}$, $CaLa_4O_7:Ce^{3+}$, $CaAl_2O_4:Eu^{2+}$, $CaAl_2O_4:Mn^{2+}$, $CaAl_4O_7:Pb^{2+}$, $Mn^{2+}$, $CaAl_2O_4:Tb^{3+}$, $Ca_3Al_2Si_3O_{12}:Ce^{3+}$, $Ca_3Al_2Si_3Oi_2:Ce^{3+}$, $Ca_3Al_2Si_3O_2:Eu^{3+}$, $Ca_2B_5O_9Br:Eu^{2+}$, $Ca_2B_5O_9Cl:Eu^{2+}$, $Ca_2B_5O_9Cl:Pb^{2+}$, $CaB_2O_4:Mn^{2+}$, $Ca_2B_2O_5:Mn^{2+}$, $CaB_2O_4:Pb^{2+}$, $CaB_2P_2O_9:Eu^{2+}$, $Ca_5B_2SiO_{10}:Eu^{3+}$, $Ca_{0.5}Ba_{0.5}Al_{12}O_{19}:Ce^{3+}$, $Mn^{2+}$, $Ca_2Ba_3(PO_4)_3Cl:Eu^{2+}$, $CaBr_2:Eu^{2+}$ in $SiO_2$, $CaCl_2:Eu^{2+}$ in $SiO_2$, $CaCl_2:Eu^{2+}$, $Mn^{2+}$ in $SiO_2$, $CaF_2:Ce^{3+}$, $CaF_2:Ce^{3+}$, $Mn^{2+}$, $CaF_2:Ce^{3+}$, $Tb^{3+}$, $CaF_2:Eu^{2+}$, $CaF_2:Mn^{2+}$, $CaF_2:U$, $CaGa_2O_4:Mn^{2+}$, $CaGa_4O_7:Mn^{2+}$, $CaGa_2S_4:Ce^{3+}$, $CaGa_2S_4:Eu^{2+}$, $CaGa_2S_4:Mn^{2+}$, $CaGa_2S_4:Pb^{2+}$, $CaGeO_3:Mn^{2+}$, $CaI_2:Eu^{2+}$ in $SiO_2$, $CaI_2:Eu^{2+}$, $Mn^{2+}$ in $SiO_2$, $CaLaBO_4:Eu^{3+}$, $CaLaB_3O_7:Ce^{3+}$, $Mn^{2+}$, $Ca_2La_2BO_{6.5}:Pb^{2+}$, $Ca_2MgSi_2O_7$, $Ca_2MgSi_2O_7:Ce^{3+}$, $CaMgSi_2O_6:Eu^{2+}$, $Ca_3MgSi_2O_8:Eu^{2+}$, $Ca_2MgSi_2O_7:Eu^{2+}$, $CaMgSi_2O_6:Eu^{2+}$, $Mn^{2+}$, $Ca_2MgSi_2O_7:Eu^{2+}$, $Mn^{2+}$, $CaMoO_4$, $CaMoO_4:Eu^{3+}$, $CaO:Bi^{3+}$, $CaO:Cd^{2+}$, $CaO:Cu^+$, $CaO:Eu^{3+}$, $CaO:Eu^{3+}$, $Na^+$, $CaO:Mn^{2+}$, $CaO:Pb^{2+}$, $CaO:Sb^{3+}$, $CaO:Sm^{3+}$, $CaO:Tb^{3+}$, $CaO:Tl$, $CaO:Zn^{2+}$, $Ca_2P_2O_7:Ce^{3+}$, $\alpha$-$Ca_3(PO_4)_2:Ce^{3+}$, $\beta$-$Ca_3(PO_4)_2:Ce^{3+}$, $Ca_5(PO_4)_3Cl:Eu^{2+}$, $Ca_5(PO_4)_3Cl:Mn^{2+}$, $Ca_5(PO_4)_3Cl:Sb^{3+}$, $Ca_5(PO_4)_3Cl:Sn^{2+}$, $\beta$-$Ca_3(PO_4)_2:Eu^{2+}$, $Mn^{2+}$, $Ca_5(PO_4)_3F:Mn^{2+}$, $Ca_s(PO_4)_3F:Sb^{3+}$, $Ca_s(PO_4)_3F:Sn^{2+}$, $\alpha$-$Ca_3(PO_4)_2:Eu^{2+}$, $\beta$-$Ca_3(PO_4)_2:Eu^{2+}$, $Ca_2P_2O_7:Eu^{2+}$, $Ca_2P_2O_7:Eu^{2+}$, $Mn^{2+}$, $CaP_2O_6:Mn^{2+}$, $\alpha$-$Ca_3(PO_4)_2:Pb^{2+}$, $\alpha$-$Ca_3(PO_4)_2:Sn^{2+}$, $\beta$-$Ca_3(PO_4)_2:Sn^{2+}$, $\beta$-$Ca_2P_2O_7:Sn$, $Mn$, $\alpha$-$Ca_3(PO_4)_2:Tr$, $CaS:Bi^{3+}$, $CaS:Bi^{3+}$, $Na$, $CaS:Ce^{3+}$, $CaS:Eu^{2+}$, $CaS:Cu^+$, $Na^+$, $CaS:La^{3+}$, $CaS:Mn^{2+}$, $CaSO_4:Bi$, $CaSO_4:Ce^{3+}$, $CaSO_4:Ce^{3+}$, $Mn^{2+}$, $CaSO_4:Eu^{2+}$, $CaSO_4:Eu^{2+}$, $Mn^{2+}$, $CaSO_4:Pb^{2+}$, $CaS:Pb^{2+}$, $CaS:Pb^{2+}$, $Cl$, $CaS:Pb^{2+}$, $Mn^{2+}$, $CaS:Pr^{3+}$, $Pb^{2+}$, $Cl$, $CaS:Sb^{3+}$, $CaS:Sb^{3+}$, $Na$, $CaS:Sm^{3+}$, $CaS:Sn^{2+}$, $CaS:Sn^{2+}$, $F$, $CaS:Tb^{3+}$, $CaS:Tb^{3+}$, $Cl$, $CaS:Y^{3+}$, $CaS:Yb^{2+}$, $CaS:Yb^{2+}$, $Cl$, $CaSiO_3:Ce^{3+}$, $Ca_3SiO_4Cl_2:Eu^{2+}$, $Ca_3SiO_4Cl_2:Pb^{2+}$, $CaSiO_3:Eu^{2+}$, $CaSiO_3:Mn^{2+}$, $Pb$, $CaSiO_3:Pb^{2+}$, $CaSiO_3:Pb^{2+}$, $Mn^{2+}$, $CaSiO_3:Ti^{4+}$, $CaSr_2(PO_4)_2:Bi^{3+}$, $\beta$-$(Ca,Sr)_3(PO_4)_2:Sn^{2+}Mn^{2+}$, $CaTi_{0.9}Al_{01}O_3:Bi^{3+}$, $CaTiO_3:Eu^{3+}$, $CaTiO_3:Pr^{3+}$, $Ca_5(VO_4)_3Cl$, $CaWO_4$, $CaWO_4:Pb^{2+}$, $CaWO_4:W$, $Ca_3WO_6:U$, $CaYAlO_4:Eu^{3+}$, $CaYBO_4:Bi^{3+}$, $CaYBO_4:Eu^{3+}$, $CaYB_{0.8}O_{3.7}:Eu^{3+}$, $CaY_2ZrO_6:Eu^{3+}$, $(Ca,Zn,Mg)_3(PO_4)_2:Sn$, $CeF_3$, $(Ce,Mg)BaAl_{11}O_{18}:Ce$, $(Ce,Mg)SrAl_{11}O_{18}:Ce$, $CeMgAl_{11}O_{19}:Ce:Tb$, $Cd_2B_6O_{11}:Mn^{2+}$, $CdS:Ag^+$, $Cr$, $CdS:In$, $CdS:In$, $CdS:In$, $Te$, $CdS:Te$, $CdWO_4$, $CsF$, $CsI$, $CsI:Na^+$, $CsI:Tl$, $(ErCl_3)_{0.25}(BaCl_2)_{0.75}$, $GaN:Zn$, $Gd_3Ga_5O_{12}:Cr^{3+}$, $Gd_3Ga_5O_{12}:Cr$, $Ce$, $GdNbO_4:Bi^{3+}$, $Gd_2O_2S:Eu^{3+}$, $Gd_2O_2Pr^{3+}$, $Gd_2O_2S:Pr$, $Ce$, $F$, $Gd_2O_2S:Tb^{3+}$, $Gd_2SiO_5:Ce^{3+}$, $KAl_{11}O_{17}:Tl^+$, $KGa_{11}O_{17}:Mn^{2+}$, $K_2La_2Ti_3O_{10}:Eu$, $KMgF_3:Eu^{2+}$, $KMgF_3:Mn^{2+}$, $K_2SiF_6:Mn^{4+}$, $LaAl_3B_4O_{12}:Eu^{3+}$, $LaAlB_2O_6:Eu^{3+}$, $LaAlO_3:Eu^{3+}$, $LaAlO_3:Sm^{3+}$, $LaAsO_4:Eu^{3+}$, $LaBr_3:Ce^{3+}$, $LaBO_3:Eu^{3+}$, $(La, Ce, Tb)PO_4:Ce:Tb$, $LaCl_3:Ce^{3+}$, $La_2O_3:Bi^{3+}$, $LaOBr:Tb^{3+}$, $LaOBr:Tm^{3+}$, $LaOCl:Bi^{3+}$, $LaOCl:Eu^{3+}$, $LaOF:Eu^{3+}$, $La_2O_3:Eu^{3+}$, $La_2O_3:Pr^{3+}$, $La_2O_2S:Tb^{3+}$, $LaPO_4:Ce^{3+}$, $LaPO_4:Eu^{3+}$, $LaSiO_3Cl:Ce^{3+}$, $LaSiO_3Cl:Ce^{3+}$, $Tb^{3+}$, $LaVO_4:Eu^{3+}$, $La_2W_3O_{12}:Eu^{3+}$, $LiAlF_4:Mn^{2+}$, $LiAl_5O_8:Fe^{3+}$, $LiAlO_2:Fe^{3+}$, $LiAlO_2:Mn^{2+}$, $LiAl_5O_8:Mn^{2+}$, $Li_2CaP_2O_7:Ce^{3+}$, $Mn^{2+}$, $LiCeBa_4Si_4O_{14}:Mn^{2+}$, $LiCeSrBa_3Si_4O_{14}:Mn^{2+}$, $LiInO_2:Eu^{3+}$, $LiInO_2:Sm^{3+}$, $LiLaO_2:Eu^{3+}$, $LuAlO_3:Ce^{3+}$, $(Lu,Gd)_2SiO_5:Ce^{3+}$, $Lu_2SiO_5:Ce^{3+}$, $Lu_2Si_2O_7:Ce^{3+}$, $LuTaO_4:Nb^{5+}$, $Lu_{1-x}Y_xAlO_3:Ce^{3+}$, $MgAl_2O_4:Mn^{2+}$, $MgSrAl_{10}O_{17}:Ce$, $MgB_2O_4:Mn^{2+}$, $MgBa_2(PO_4)_2:Sn^{2+}$, $MgBa_2(PO_4)_2:U$, $MgBaP_2O_7:Eu^{2+}$, $MgBaP_2O_7:Eu^{2+}$, $Mn^{2+}$, $MgBa_3Si_2O_8:Eu^{2+}$, $MgBa(SO_4)_2:Eu^{2+}$, $Mg_3Ca_3(PO_4)_4:Eu^{2+}$, $MgCaP_2O_7:Mn^{2+}$, $Mg_2Ca(SO_4)_3:Eu^{2+}$, $Mg_2Ca(SO_4)_3:Eu^{2+}$, $Mn^2$, $MgCeAl_nO_{19}:Tb^{3+}$, $Mg_4(F)GeO_6:Mn^{2+}$, $Mg_4(F)(Ge,Sn)O_6:Mn^{2+}$, $MgF_2:Mn^{2+}$, $MgGa_2O_4:Mn^{2+}$, $Mg_8Ge_2O_{11}F_2:Mn^{4+}$, $MgS:Eu^{2+}$, $MgSiO_3:Mn^{2+}$, $Mg_2SiO_4:Mn^{2+}$, $Mg_3SiO_3F_4:Ti^{4+}$, $MgSO_4:Eu^{2+}$, $MgSO_4:Pb^{2+}$, $MgSrBa_2Si_2O_7:Eu^{2+}$, $MgSrP_2O_7:Eu^{2+}$, $MgSr_5(PO_4)_4:Sn^{2+}$, $MgSr_3Si_2O_8:Eu^{2+}$, $Mn^{2+}$, $Mg_2Sr(SO_4)_3:Eu^{2+}$, $Mg_2TiO_4:Mn^{4+}$, $MgWO_4$, $MgYBO_4:Eu^{3+}$, $Na_3Ce(PO_4)_2:Tb^{3+}$, $NaI:Tl$, $Na_{1.23}K_{0.42}Eu_{0.12}TiSi_4O_{11}:Eu^{3+}$, $Na_{1.23}K_{0.42}Eu_{0.12}TiSi_5O_{13}.xH_2O:Eu^{3+}$, $Na_{1.29}K_{0.46}Er_{0.08}TiSi_4O_{11}:Eu^{3+}$, $Na_2Mg_3Al_2Si_2O_{10}:Tb$, $Na(Mg_{2-x}Mn_x)LiSi_4O_{10}F_2:Mn$, $NaYF_4:Er^{3+}$, $Yb^{3+}$, $NaYO_2:Eu^{3+}$, $P46(70\%)+P47$ $(30\%)$, $SrAl_{12}O_{19}:Ce^{3+}$, $Mn^{2+}$, $SrAl_2O_4:Eu^{2+}$, $SrAl_4O_7:Eu^{3+}$, $SrAl_{12}O_{19}:Eu^{2+}$, $SrAl_2S_4:Eu^{2+}$, $Sr_2B_5O_9Cl:Eu^{2+}$, $SrB_4O_7:Eu^{2+}(F, Cl, Br)$, $SrB_4O_7:Pb^{2+}$, $SrB_4O_7:Pb^{2+}$, $Mn^{2+}$, $SrB_8O_{13}:Sm^{2+}$, $Sr_xBa_yCl_zAl_2O_{4-z/2}$: $Mn^{2+}$, $Ce^{3+}$, $SrBaSiO_4:Eu^{2+}$, $Sr(Cl,Br,I)_2:Eu^{2+}$ in $SiO_2$, $SrCl_2:Eu^{2+}$ in $SiO_2$, $Sr_5Cl(PO_4)_3:Eu$, $Sr_wF_xB_4O_{6.5}:Eu^{2+}$, $Sr_wF_xB_yO_z:Eu^{2+},Sm^{2+}$, $SrF_2:Eu^{2+}$, $SrGa_{12}O_{19}:Mn^{2+}$, $SrGa_2S_4:Ce^{3+}$, $SrGa_2S_4:Eu^{2+}$, $SrGa_2S_4:Pb^{2+}$, $SrIn_2O_4:Pr^{3+}$, $Al^{3+}$, $(Sr,Mg)_3(PO_4)_2:Sn$, $SrMgSi_2O_6:Eu^{2+}$, $Sr_2MgSi_2O_7:Eu^{2+}$, $Sr_3MgSi_2O_8:Eu^{2+}$, $SrMoO_4:U$, $SrO.3B_2O_3:Eu^{2+}$, $Cl$, $\beta$-$SrO.3B_2O_3:Pb^{2+}$, $\beta$-$SrO.3B_2O_3:Pb^{2+}$, $Mn^{2+}$, $\alpha$-$SrO.3B_2O_3:Sm^{2+}$, $Sr_6P_5BO_{20}:Eu$, $Sr_5(PO_4)_3Cl:Eu^{2+}$, $Sr_5(PO_4)_3Cl:Eu^{2+},Pr^{3+}$, $Sr_5(PO_4)_3Cl:Mn^{2+}$, $Sr_5(PO_4)_3Cl:Sb^{3+}$, $Sr_2P_2O_7:Eu^{2+}$, $\beta$-$Sr_3(PO_4)_2:Eu^{2+}$, $Sr_5(PO_4)_3F:Mn^{2+}$, $Sr_5(PO_4)_3F:Sb^{3+}$, $Sr_5(PO_4)_3F:Sb^{3+}$, $Mn^{2+}$, $Sr_5(PO_4)_3F:Sn^{2+}$, $Sr_2P_2O_7:Sn^{2+}$, $\beta$-$Sr_3(PO_4)_2:Sn^{2+}$, $\beta$-$Sr_3(PO_4)_2:Sn^{2+}$, $Mn^{2+}(Al)$, $SrS:Ce^{3+}$, $SrS:Eu^{2+}$, $SrS:Mn^{2+}$, $SrS:Cu^+$, $Na$, $SrSO_4:Bi$, $SrSO_4:Ce^{3+}$, $SrSO_4:Eu^{2+}$, $SrSO_4:Eu^{2+}$, $Mn^{2+}$, $Sr_5Si_4O_{10}Cl_6:Eu^{2+}$, $Sr_2SiO_4:Eu^{2+}$, $SrTiO_3:Pr^{3+}$, $SrTiO_3:Pr^{3+}$, $Al^{3+}$, $Sr_3WO_6:U$, $SrY_2O_3:Eu^{3+}$, $ThO_2:Eu^{3+}$, $ThO_2:Pr^{3+}$, $ThO_2:Tb^{3+}$, $YAl_3B_4O_{12}:Bi^{3+}$, $YAl_3B_4O_{12}:Ce^{3+}$, $YAl_3B_4O_{12}:Ce^{3+}$, $Mn$, $YAl_3B_4O_{12}:Ce^{3+}$, $Tb^{3+}$, $YAl_3B_4O_{12}:Eu^{3+}$, $YAl_3B_4O_{12}:Eu^{3+},Cr^{3+}$, $YAl_3B_4O_{12}:Th^{4+}$, $Ce^{3+}$, $Mn^{2+}$, $YAlO_3:Ce^{3+}$, $Y_3Al_5O_{12}:Ce^{3+}$, $Y_3Al_5O_{12}:Cr^{3+}$, $YAlO_3:Eu^{3+}$, $Y_3Al_5O_{12}:Eu^{3+}$, $Y_4Al_2O_9:Eu^{3+}$, $Y_3Al_5O_{12}:Mn^{4+}$, $YAlO_3:Sm^{3+}$, $YAlO_3:Tb^{3+}$, $Y_3Al_5O_{12}:Tb^{3+}$, $YAsO_4:Eu^{3+}$, $YBO_3:Ce^{3+}$, $YBO_3:Eu^{3+}$, $YF_3:Er^{3+},Yb^{3+}$, $YF_3:Mn^{2+}$, $YF_3:Mn^{2+}$, $Th^{4+}$, $YF_3:Tm^{3+},Yb^{3+}$, $(Y,Gd)BO_3:Eu$, $(Y,Gd)BO_3:Tb$, $(Y,Gd)_2O_3:Eu^{3+}$, $Y_{1.34}Gd_{0.60}O_3(Eu,Pr)$, $Y_2O_3:Bi^{3+}$, $YOBrEu^{3+}$, $Y_2O_3:Ce$, $Y_2O_3:Er^{3+}$, $Y_2O_3:Eu^{3+}(YOE)$, $Y_2O_3:Ce^{3+}$, $Tb^{3+}$, $YOCl:Ce^{3+}$, $YOCl:Eu^{3+}$, $YOF:Eu^{3+}$, $YOF:Tb^{3+}$, $Y_2O_3:Ho^{3+}$, $Y_2O_2S:Eu^{3+}$, $Y_2O_2S:Pr^{3+}$, $Y_2O_2S:Tb^{3+}$, $Y_2O_3:Tb^{3+}$, $YPO_4:Ce^{3+}$, $YPO_4:Ce^{3+}$, $Tb^{3+}$, $YPO_4:Eu^{3+}$, $YPO_4:Mn^{2+}$, $Th^{4+}$, $YPO_4:V^{5+}$, $Y(P,V)O_4:Eu$, $Y_2SiO_5:Ce^{3+}$, $YTaO_4$, $YTaO_4:Nb^{5+}$, $YVO_4:Dy^{3+}$, $YVO_4:Eu^{3+}$, $ZnAl_2O_4:Mn^{2+}$, $ZnB_2O_4:Mn^{2+}$, $ZnBa_2S_3:Mn^{2+}$, $(Zn,Be)_2SiO_4:Mn^{2+}$, $Zn_{0.4}Cd_{0.6}S:Ag$, $Zn_{0.6}Cd_{0.4}S:Ag$, $(Zn,Cd)S:Ag$, $Cl$, $(Zn,Cd)S:Cu$, $ZnF_2:Mn^{2+}$, $ZnGa_2O_4$, $ZnGa_2O_4:Mn^{2+}$, $ZnGa_2S_4:Mn^{2+}$, $Zn_2GeO_4:Mn^{2+}$, $(Zn,Mg)F_2:Mn^{2+}$, $ZnMg_2(PO_4)_2:Mn^{2+}$, $(Zn,Mg)_3(PO_4)_2:Mn^{2+}$, $ZnO:Al^{3+}$, $Ga^{3+}$, $ZnO:Bi^{3+}$, $ZnO:Ga^{3+}$, $ZnO:Ga$, $ZnO$—$CdO:Ga$, $ZnO:S$, $ZnO:Se$, $ZnO:Zn$, $ZnS:Ag^+,Cl^-$, $ZnS:Ag,Cu$, $Cl$, $ZnS:Ag,Ni$, $ZnS:Au,In$, $ZnS$—$CdS$ (25-75), $ZnS$—$CdS$ (50-50), $ZnS$—$CdS$ (75-25), $ZnS$—$CdS:Ag,Br,Ni$, $ZnS$—$CdS:Ag^+$, $Cl$, $ZnS$—$CdS:Cu,Br$, $ZnS$—$CdS:Cu,I$, $ZnS:Cl^-$, $ZnS:Eu^{2+}$, $ZnS:Cu$, $ZnS:Cu^+$, $Al^{3+}$, $ZnS:Cu^+,Cl^-$, $ZnS:Cu,Sn$, $ZnS:Eu^{2+}$, $ZnS:Mn^{2+}$, $ZnS:Mn,Cu$, $ZnS:Mn^{2+},Te^{2+}$, $ZnS:P$, $ZnS:P^{3-},Cl^-$, $ZnS:Pb^{2+},Cl^-$, $ZnS:Pb,Cu$, $Zn_3(PO_4)_2:Mn^{2+}$, $Zn_2SiO_4:Mn^{2+}$, $Zn_2SiO_4:Mn^{2+},As^{5+}$, $Zn_2SiO_4:Mn,Sb_2O_2$, $Zn_2SiO_4:Mn^{2+},P$, $Zn_2SiO_4:Ti^{4+}$, $ZnS:Sn^{2+}$, $ZnS:Sn,Ag$, $ZnS:Sn^{2+},Li^+$, $ZnS:Te$, $Mn$, $ZnS$—$ZnTe:Mn^{2+}$, $ZnSe:Cu^+,Cl$ and $ZnWO_4$.

As mentioned above, the phosphors according to the present invention can be excited over a broad range, extending from about 300 nm to 500 nm.

Accordingly, the present invention also relates to the use of at least one compound according to the present invention as conversion phosphor for the partial or complete conversion of the blue or near UV emission from a luminescent diode.

The present invention also relates to a light source, comprising a primary light source with an emission maximum in the range of 300 nm to 500 nm, and all or some of this radiation is converted into longer-wavelength radiation by a compound or an emission-converting material in accordance with the present invention.

Preferably, the illumination unit comprises a blue or near UV LED and at least one compound according to the present invention. Such illumination unit is preferably white-light-emitting, in particular having a colour coordinate of CIE x=0.12-0.43 and CIE y=0.07-0.43, more preferably CIE x=0.15-0.35 and CIE y=0.10-0.35, Preference is furthermore given to an illumination unit, in particular for general lighting, which is characterised in that it has a CRI>60, preferably >70, more preferably >80.

In another embodiment, the illumination unit emits light having a certain colour point (colour-on-demand principle). The colour-on-demand concept is taken to mean the production of light having a certain colour point using a pcLED (=phosphor-converted LED) using one or more phosphors. This concept is used, for example, in order to produce certain corporate designs, for example for illuminated company logos, trademarks, etc.

Especially for the purpose that certain colour spaces should be established, the phosphor is preferably mixed with at least one further phosphor selected from the group of oxides, molybdates, tungstates, vanadates, garnets, silicates, aluminates, nitrides and oxynitrides, in each case individually or mixtures thereof with one or more activator ions, such as Ce, Eu, Mn, Cr and/or Bi.

Suitable green emitting phosphors, are preferably selected from Ce-doped lutetium-containing garnets or yttrium-containing garnets, Eu-doped sulfoselenides, thiogallates, $BaMgAl_{10}O_{17}$: Eu, Mn (BAM: Eu, Mn), and/or Ce- and/or Eu-doped nitride containing phosphors and/or β-SiAlON: Eu, and/or Eu-doped alkaline earth ortho-silicates, and/or Eu-doped alkaline earth oxy-ortho-silicates, and/or Zn-doped alkaline earth ortho-silicates.

Suitable blue-emitting phosphor, are preferably selected from BAM: Eu and/or $Sr_{10}(PO_4)_6Cl_2$:Eu, and/or $CaWO_4$, and/or ZnS:(Au, Cu, Al), and/or $Sr_4Al_{14}O_{25}$:Eu, and/or $Sr_5(PO_4)_3Cl$:Eu, and/or $Sr_2P_2O_7$:Eu.

Suitable phosphors emitting yellow light, can preferably be selected from garnet phosphors (e.g., $(Y, Tb, Gd)_3(Al, Ga)_5O_{12}$:Ce), ortho-silicate phosphors (e.g., $(Ca, Sr, Ba)_2SiO_4$: Eu), and/or Sialon-phosphors (e.g., α-SiAlON: Eu), and/or $(Ca, Sr, Ba)AlSi_4N_7$:Ce.

The term "blue-emitting phosphor" refers to a phosphor emitting a wavelength having at least one emission maximum between 435 nm and 507 nm.

The term "green emitting phosphor" refers to a phosphor emitting a wavelength having at least one emission maximum between 508 nm and 550 nm.

The term "yellow emitting phosphor" or refers to a phosphor emitting a wavelength having at least one emission maximum between 551 nm and 585 nm.

The term "red-emitting phosphor" refers to a phosphor emitting a wavelength having at least one emission maximum between 586 and 670 nm.

In a preferred embodiment, the illumination unit according to the invention comprises a light source, which is a luminescent indium aluminium gallium nitride, in particular of the formula $In_tGa_jAl_kN$, where $0 \leq i$, $0 \leq j$, $0 \leq k$, and $i+j+k=1$ and/or a light source, which is a luminescent indium gallium nitride (InxGa1-xN, where 0<x<0.4).

In a another preferred embodiment of the illumination unit according to the invention, the light source is a luminescent arrangement based on ZnO, TCO (transparent conducting oxide), ZnSe or SiC or an arrangement based on an organic light-emitting layer (OLED).

In a further preferred embodiment of the illumination unit according to the invention, the light source is a source which exhibits electroluminescence and/or photoluminescence. The light source may furthermore also be a plasma or discharge source. Possible forms of light sources of this type are known to the person skilled in the art. These can be light-emitting LED chips of various structures.

The compounds according to the present invention can either be dispersed in a resin (for example epoxy or silicone resin) or, in the case of suitable size ratios, arranged directly on the light source or alternatively arranged remote there from, depending on the application (the latter arrangement also includes "remote phosphor technology"). The advantages of remote phosphor technology are known to the person skilled in the art and are revealed, for example, by the following publication: Japanese Journal of Appl. Phys. Vol. 44, No. 21 (2005). L649-L651.

The compounds according to the present invention are also suitable for converting parts of solar irradiation having a wavelength of less than approximately 500 nm into radiation of a wavelength of more than approximately 500 nm, which can be utilized more effectively by a variety of semiconductor materials in solar cells.

Therefore, the present invention also relates to the use of at least one compound according to the invention as a wavelength conversion material for solar cells.

Thus, the invention relates also to a method of improvement of a solar cell module by applying e.g. a polymer film comprising a phosphor according to the present invention, which is capable to increase the light utilization efficiency and the power-generating efficiency, due to a wavelength conversion of the shortwave part of the solar irradiation spectrum which normally cannot be utilized due to the absorption characteristics of the semiconductor material in the solar cell module.

The present invention is described above and below with particular reference to the preferred embodiments. It should be understood that various changes and modifications might be made therein, without departing from the spirit and scope of the invention.

Many of the compounds or mixtures thereof mentioned above and below, are commercially available. The organic compounds are either known or can be prepared by methods which are known per se, as described in the literature (for example in the standard works such as Houben-Weyl, Methoden der Organischen Chemie [Methods of Organic Chemistry], Georg-Thieme-Verlag, Stuttgart), to be precise under reaction conditions which are known and suitable for said reactions. Use may also be made here of variants which are known per se, but are not mentioned here.

Unless the context clearly indicates otherwise, as used herein plural forms of the terms herein are to be construed as including the singular form and vice versa.

Throughout this application, unless explicitly stated otherwise, all concentrations are given in weight percent and relate to the respective complete mixture, all temperatures are given in degrees centigrade (Celsius) and all differences of temperatures in degrees centigrade.

Throughout the description and claims of this specification, the words "comprise" and "contain" and variations of the words, for example "comprising" and "comprises", mean "including but not limited to", and are not intended to (and do not) exclude other components. On the other hand, the word "comprise" also encompasses the term "consisting of" but is not limited to it.

It will be appreciated that variations to the foregoing embodiments of the invention can be made while still falling within the scope of the invention. Alternative features serving the same, equivalent, or similar purpose may replace each feature disclosed in this specification, unless stated otherwise. Thus, unless stated otherwise, each feature disclosed is only one example of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to, or alternative to any invention presently claimed.

The invention will now be described in more detail by reference to the following examples, which are illustrative only and do not limit the scope of the invention.

EXAMPLES

Example 1

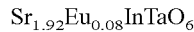

7.985 g of $In_2O_3$, 17.680 g $SrCO_3$, 13.223 g $Ta_2O_5$, 0.211 g $Eu_2O_3$ are weight out and mixed using a speed mixer at 1800 rpm for 5 minutes.

The resulting mixture is fired at 1100° C. in air for 8 hours. Subsequently, the powder obtained is grounded and fired a second time at 1500° C. for 4 hours under an argon atmosphere, whereby an $N_2$ atmosphere is applied during the heat up phase from ambient temperature up to 1250° C. The raw product is grounded using a mechanical agate mortar and piston and the resulting powder is sieved using a 50 μm nylon sieve.

Figure 2:
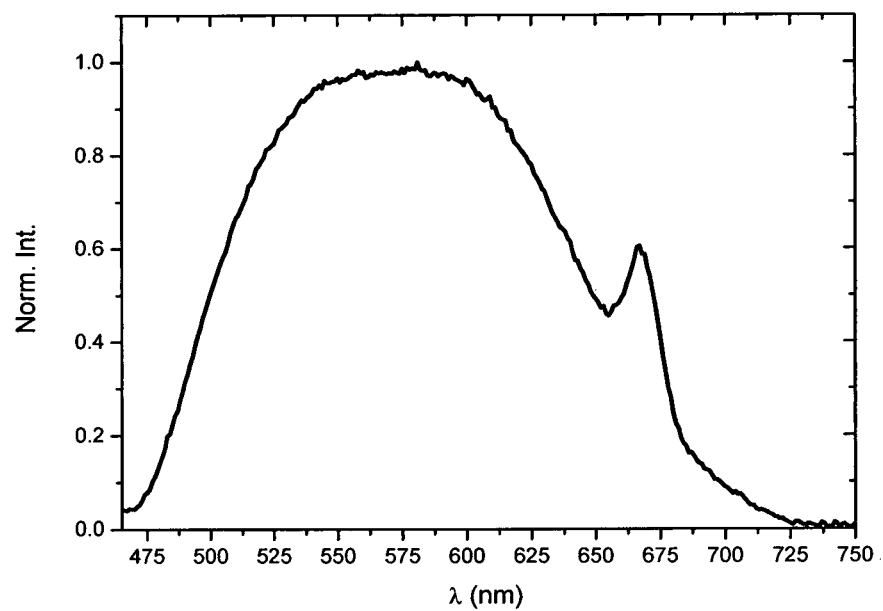
FIG. 2 shows an emission spectrum of $Sr_2InTaO_6:Eu^{2+}$ upon excitation with radiation at a wavelength of 450 nm.
Figure 3:
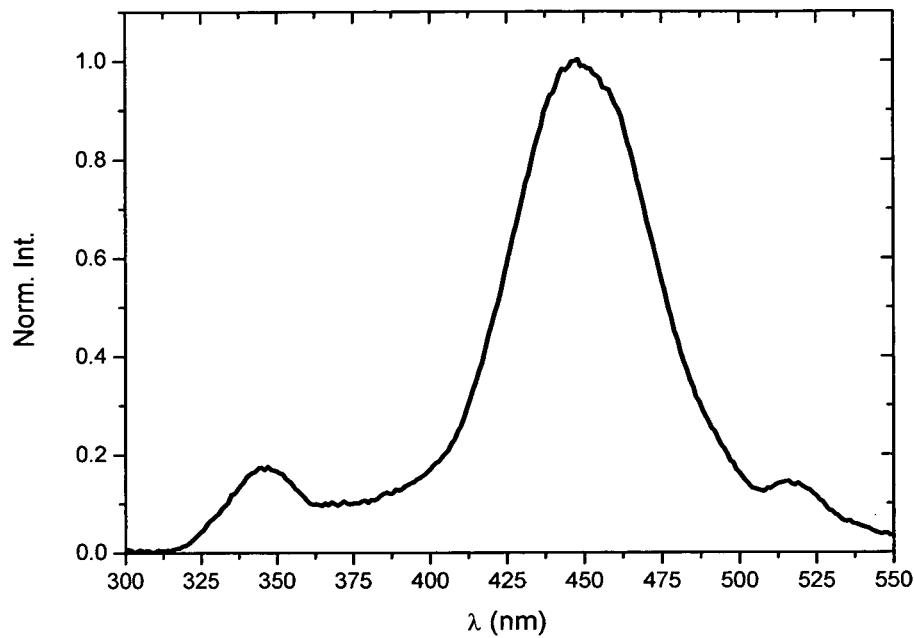
FIG. 3 shows an excitation spectrum of $Sr_2InTaO_6:Eu^{2+}$ for emission wavelength of 575 nm.

The product is characterized by XRD (FIG. 1). The corresponding emission and excitation spectra of the phosphor of the formula $Sr_{1.92}Eu_{0.08}InTaO_6$ are depicted in FIG. 2 and FIG. 3.

Example 2

$Ba_{1.92}Eu_{0.08}InTaO_6$ 7.985 g of In2O3, 23.633 g BaCO3, 13.223 g Ta2O5, 0.211 g Eu2O3 are weight out and mixed using a speed mixer at 1800 rpm for 5 minutes. The resulting mixture is fired at 1100° C. in air for 8 hours. Subsequently, the powder obtained is grounded and fired a second time at 1500° C. for 4 hours under an argon atmosphere, whereby an $N_2$ atmosphere is applied during the heat up phase from ambient temperature up to 1250° C. The raw product is grounded using a mechanical agate mortar and piston and the resulting powder is sieved using a 50 μm nylon sieve.

Example 3

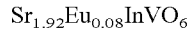

7.985 g of In2O3, 17.680 g SrCO3, 5.4425 g V2O5, 0.211 g Eu2O3 are weight out and mixed using a speed mixer at 1800 rpm for 5 minutes. The resulting mixture is fired at 1100° C. in air for 8 hours. Subsequently, the powder obtained is grounded and fired a second time at 1500° C. for 4 hours under an argon atmosphere, whereby an $N_2$ atmosphere is applied during the heat up phase from ambient temperature up to 1250° C. The raw product is grounded using a mechanical agate mortar and piston and the resulting powder is sieved using a 50 μm nylon sieve.

Example 4

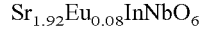

7.985 of In2O3, 17.680 g SrCO3, 7.954 g Nb2O5, 0.211 g Eu2O3 are weight out and mixed using a speed mixer at 1800 rpm for 5 minutes. The resulting mixture is fired at 1100° C. in air for 8 hours. Subsequently, the powder obtained is grounded and fired a second time at 1500° C. for 4 hours under an argon atmosphere, whereby an $N_2$ atmosphere is applied during the heat up phase from ambient temperature up to 1250° C. The raw product is grounded using a mechanical agate mortar and piston and the resulting powder is sieved using a 50 μm nylon sieve.

Example 5

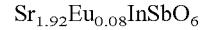

7.985 g of In2O3, 17.680 g SrCO3, 9.681 g Sb2O5, 0.211 g Eu2O3 are weight out and mixed using a speed mixer at 1800 rpm for 5 minutes. The resulting mixture is fired at 1100° C. in air for 8 hours. Subsequently, the powder obtained is grounded and fired a second time at 1500° C. for 4 hours under an argon atmosphere, whereby an $N_2$ atmosphere is applied during the heat up phase from ambient temperature up to 1250° C.

The raw product is grounded using a mechanical agate mortar and piston and the resulting powder is sieved using a 50 μm nylon sieve.

Example 6

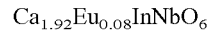

7.985 g of In2O3, 11.986 g CaCO3, 7.954 g Nb2O5, 0.211 g Eu2O3 are weight out and mixed using a speed mixer at 1800 rpm for 5 minutes. The resulting mixture is fired at 1100° C. in air for 8 hours. Subsequently, the powder obtained is grounded and fired a second time at 1500° C. for 4 hours under an argon atmosphere, whereby an $N_2$ atmosphere is applied during the heat up phase from ambient temperature up to 1250° C. The raw product is grounded using a mechanical agate mortar and piston and the resulting powder is sieved using a 50 μm nylon sieve.

LED EXAMPLES

Example 1

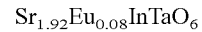

Figure 4:
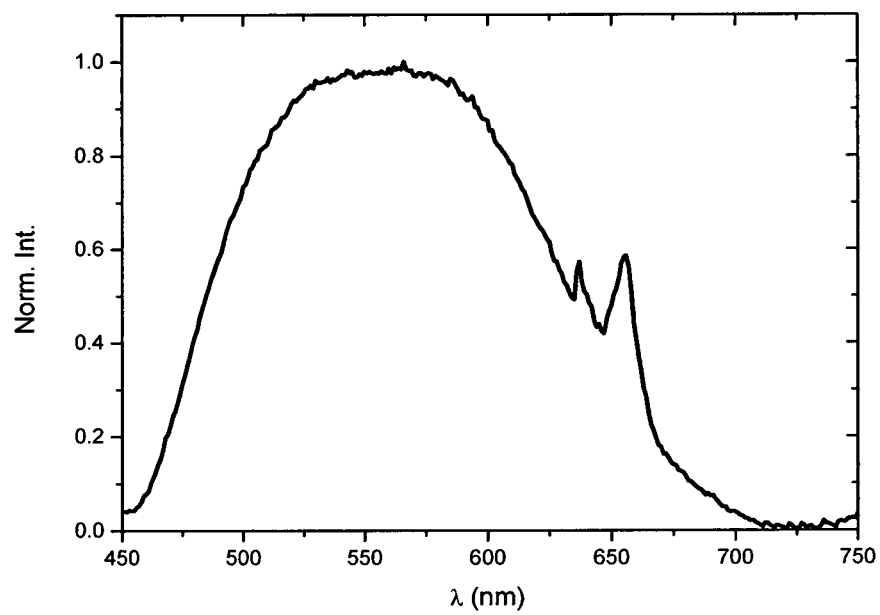
FIG. 4 shows an emission spectrum of $Ba_2InTaO_6:Eu^{2+}$ upon excitation with radiation at a wavelength of 450 nm.
Figure 5:
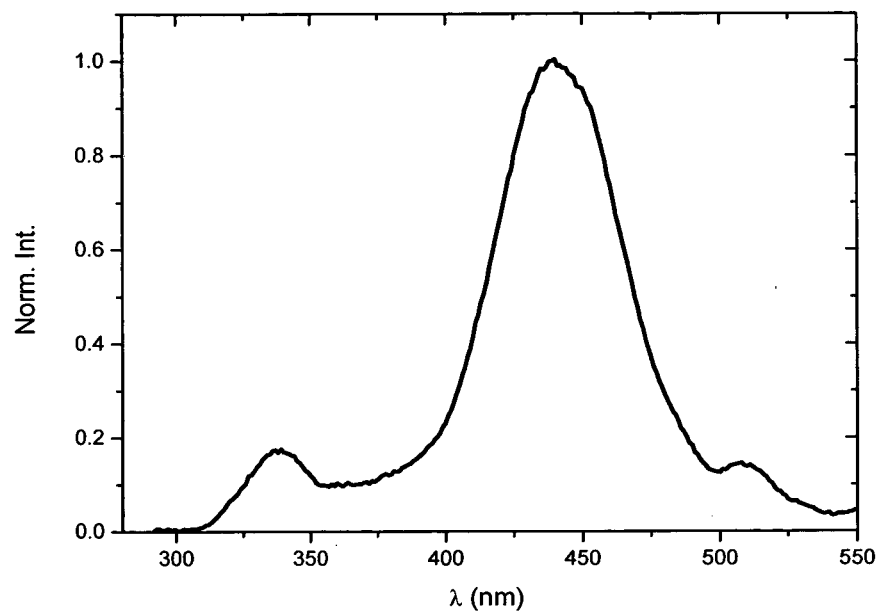
FIG. 5 shows an excitation spectrum of $Ba_2InTaO_6:Eu^{2+}$ for emission wavelength of 560 nm.
Figure 6:
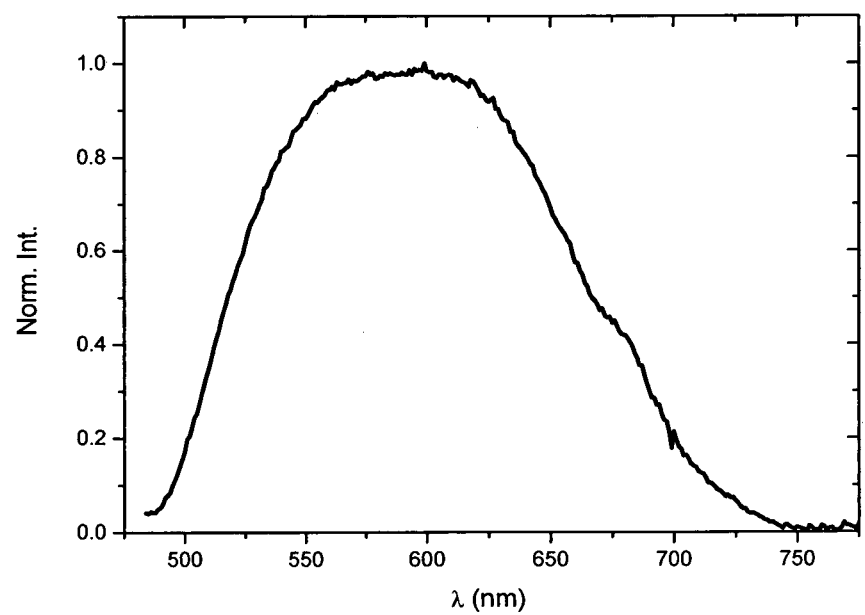
FIG. 6 shows an emission spectrum of $Ca_2InTaO_6:Eu^{2+}$ upon excitation with radiation at a wavelength of 450 nm.
Figure 7:
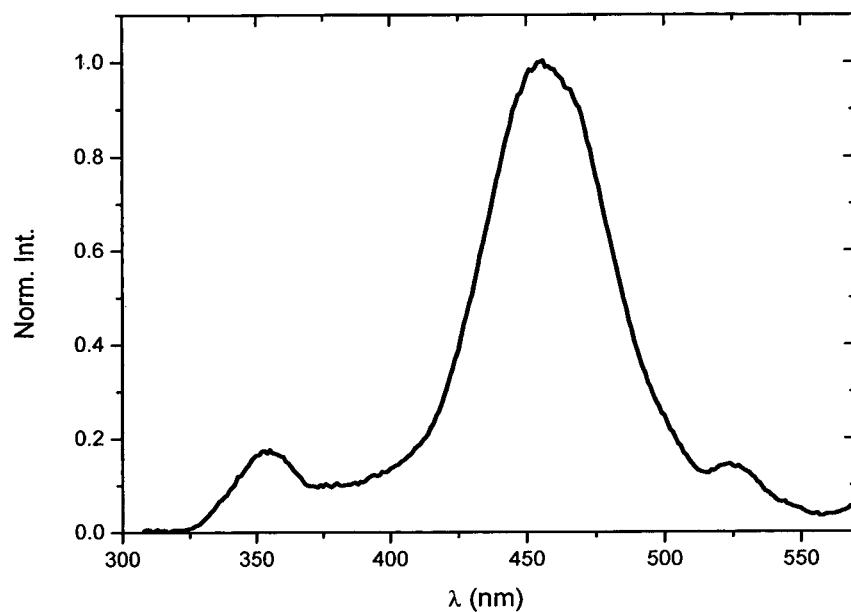
FIG. 7 shows an excitation spectrum of $Ca_2InTaO_6:Eu^{2+}$ for emission wavelength of 595 nm.
Figure 8:
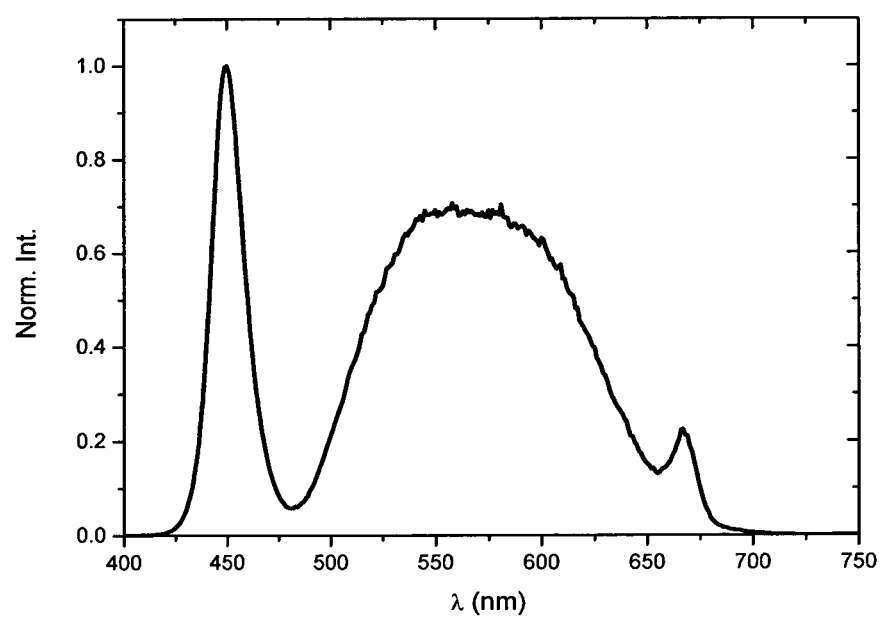
FIG. 8 shows an example LED spectrum of $Sr_2InTaO_6:Eu^{2+}$ in a blue LED emitting primary light at 450 nm.

Example spectrum of the phosphor is given in FIG. 4, where the narrow emission band at 450 nm originates from the blue LED chip, while the broad band spectral feature is the emission of the phosphor under the blue LED excitation.

The invention claimed is:

1. Compound of formula I, $$M^{II}_2 M^{III} M^V O_6 : Eu^{2+}$$

wherein
- $M^{II}$ denotes one or more bivalent elements selected from the group of Be, Mg, Ca, Sr, Ba, and Zn
- $M^{III}$ denotes one or more trivalent elements selected from the group of B, Al, Ga, In, Tl, Sc, Y, La, Ce, Gd, and Lu, and
- $M^V$ denotes one or more pentavalent elements selected from the Group of V, Nb, Ta, As, Sb, and Bi.

2. The compound according to claim 1, characterized in that the compound of formula I is selected from the formula Ia, $$M^{II}_{(2-x)} M^{III} M^V O_6 : Eu^{2+}_x \quad \text{Ia}$$

wherein
$M^{II}$, $M^{III}$, and $M^V$ have the same meanings as given in claim 1, and $0 > x \leq 2$.

3. The compound according to claim 1, characterized in that the compound of formula I is selected from the formula Ia-1, $$M^{II}_{(2-x)} (M^1_{(a-b)} M^2_b) M^V O_6 : Eu^{2+}_x \quad \text{Ia-1}$$

wherein x, $M^{II}$ and $M^V$ have the same meanings as given above in claims 1, $M^1$ and $M^2$ denote each and independently from another one element selected from B, Al, Ga, In, Tl, Sc, Y, La, Ce, Gd, or Lu, whereby $M^1 \neq M^2$, $0 < a \leq 1$, $0 \leq b < 1$, and $a+b=1$.

4. The compound according to claim 3, characterized in that b=0.

5. The compound according to claim 3, characterized in that $M^1$ denotes In.

6. The compound according to claim 1, characterized in that $M^{II}$ denotes one bivalent element selected from Be, Mg, Ca, Sr, Ba, or Zn.

7. The compound according to claim 1, characterized in that $M^V$ denotes one pentavalent element selected from V, Nb, Ta, As, Sb, or Bi.

8. The compound according to claim 2, characterized in that $0 < x < 0.3$.

9. A process for the preparation of a compound according to claim 1, which includes the following process steps:

a) mixing at least one salt containing Eu, one or more salts comprising at least element selected from of Be, Mg, Ca, Sr, Ba, and Zn, one or more salts comprising at least one element selected from B, Al, Ga, In, Tl, Sc, Y, La, Ce, Gd, and Lu, one or more salts comprising at least one element selected from V, Nb, Ta, As, Sb, and Bi, at a predetermined molar ratio;

b) optionally grinding the mixture;

b) performing a primary heat treatment on the mixture in a temperature range of 800 to 1300° C. under an oxidative atmosphere; and c) performing a secondary heat treatment on the mixture in a temperature range of 1200 to 1700° C. under a reductive atmosphere.

10. The process according to claim 9, wherein the salts in step a) are selected from the group of oxides, halides, hydrogensulfates, or carbonates.

11. A method for the partial or complete conversion of the blue or near-UV emission comprising converting said emission with a phosphor according to claim 1.

12. An emission-converting material comprising the compound according to claim 1.

13. A light source, comprising a primary light source with an emission maximum in the range of 300 nm to 500 nm, and a compound according to claim 1.

14. The light source according to claim 13 wherein the primary light source is a luminescent indium aluminium gallium nitride, and/or indium gallium nitride.

15. An Illumination unit comprising at least one light source according to claim 13.

16. A light source, comprising a primary light source with an emission maximum in the range of 300 nm to 500 nm, and an emission-converting material according to claim 12.

17. The light source according to claim 16 wherein the primary light source is a luminescent indium aluminium gallium nitride, and/or indium gallium nitride.

18. An Illumination unit comprising at least one light source according to claim 17.

* * * * *